US012813179B2

(12) United States Patent
Su et al.

(10) Patent No.: US 12,813,179 B2
(45) Date of Patent: Nov. 24, 2026

(54) STRUCTURE AND FORMATION METHOD OF SEMICONDUCTOR DEVICE STRUCTURE WITH THROUGH SEMICONDUCTOR VIA

(71) Applicant: Taiwan Semiconductor Manufacturing Company, Ltd., Hsinchu (TW)

(72) Inventors: Chih-Chuan Su, Hsinchu City (TW); Liang-Wei Wang, Hsinchu City (TW); Tsung-Chieh Hsiao, Changhua County (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 596 days.

(21) Appl. No.: 18/315,672

(22) Filed: May 11, 2023

(65) Prior Publication Data

US 2024/0379361 A1 Nov. 14, 2024

(51) Int. Cl.

| | |
|---|---|
| ***H10P 32/14*** | (2026.01) |
| ***H10P 32/10*** | (2026.01) |
| ***H10W 20/00*** | (2026.01) |
| ***H10W 20/44*** | (2026.01) |
| ***H10W 90/00*** | (2026.01) |
| ***H10W 90/20*** | (2026.01) |
| ***H10W 90/28*** | (2026.01) |

(52) U.S. Cl.

CPC ............ *H10P 32/14* (2026.01); *H10P 32/171* (2026.01); *H10W 20/056* (2026.01); *H10W 20/062* (2026.01); *H10W 20/4421* (2026.01); *H10W 90/00* (2026.01); *H10W 90/28* (2026.01); *H10W 90/297* (2026.01); *H10W 90/792* (2026.01)

(58) Field of Classification Search

CPC ......... H01L 21/76898; H01L 21/76883; H01L 21/7684; H01L 21/2251

See application file for complete search history.

(56) References Cited

U.S. PATENT DOCUMENTS

| | | | | |
|---|---|---|---|---|
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 11,018,053 | B2 * | 5/2021 | Khaderbad | H10D 84/038 |

(Continued)

*Primary Examiner* — Alexander G Ghyka

(74) *Attorney, Agent, or Firm* — McClure, Qualey & Rodack, LLP

(57) ABSTRACT

A semiconductor device structure and a formation method are provided. The method includes forming an opening in a semiconductor body, and the semiconductor body is p-type doped. The method also includes introducing n-type dopants into the semiconductor body to form a modified portion near the opening, and the modified portion is p-type doped. The method further includes forming a dielectric layer along the sidewalls and the bottom of the opening. In addition, the method includes forming a conductive structure over the dielectric layer to fill the opening.

20 Claims, 20 Drawing Sheets

(56) References Cited

U.S. PATENT DOCUMENTS

| | | | | |
|---|---|---|---|---|
| 2011/0201161 | A1* | 8/2011 | Ervin | H10D 30/60<br>257/E21.409 |
| 2017/0200697 | A1* | 7/2017 | Kao | H01L 21/76898 |
| 2017/0345812 | A1* | 11/2017 | Chou | H10D 88/01 |
| 2024/0096927 | A1* | 3/2024 | Chang | H01L 23/481 |
| 2024/0413087 | A1* | 12/2024 | Chin | H01L 21/76883 |

* cited by examiner

STRUCTURE AND FORMATION METHOD OF SEMICONDUCTOR DEVICE STRUCTURE WITH THROUGH SEMICONDUCTOR VIA

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
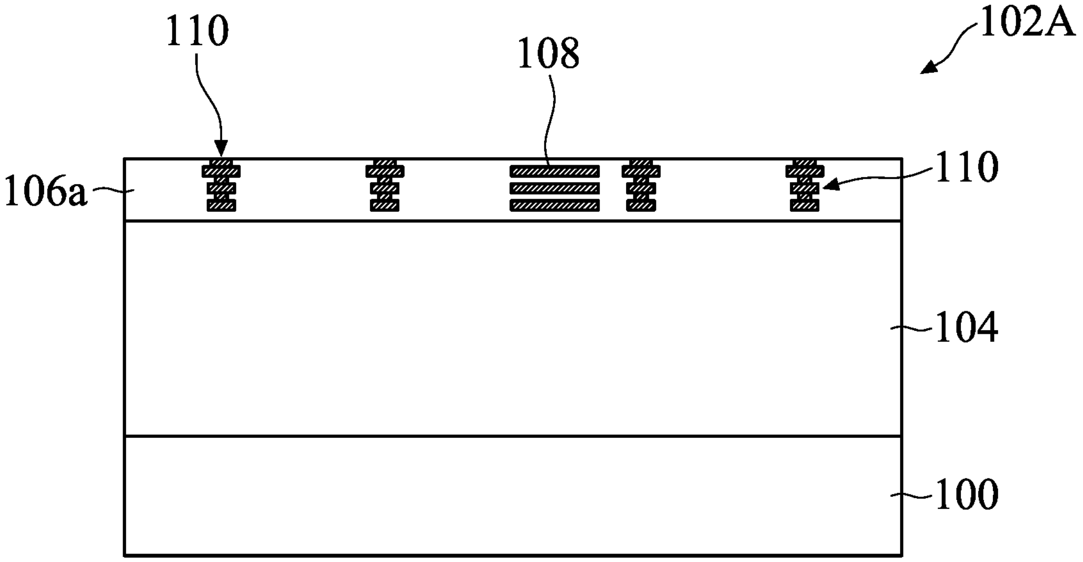
FIGS. 1A-1M are cross-sectional views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure and/or the package structure. Some of the features described below can be replaced or eliminated for different embodiments. Although some embodiments are discussed with operations performed in a particular order, these operations may be performed in another logical order.

Embodiments of the disclosure may relate to package structures such as three-dimensional (3D) packaging, 3D-IC devices, and 2.5D packaging. Embodiments of the disclosure form a package structure including a substrate that carries one or more dies or packages and a protective element (such as a protective lid) aside the dies or packages. The protective element may also function as a warpage-control element and/or heat dissipation element.

Other features and processes may also be included. For example, testing structures may be included to aid in the verification testing of the 3D packaging, 3DIC devices, and/or 2.5 D packaging. The testing structures may include, for example, test pads formed in a redistribution layer or on a substrate that allows testing to be conducted using probes or probe cards and the like. Verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1F are cross-sectional views of various stages of a process for forming a portion of a semiconductor device structure, in accordance with some embodiments. As shown in FIG. 1A, a chip structure (or a chip-containing structure) 102A is disposed over a carrier substrate 100, in accordance with some embodiments. The carrier substrate 100 may be a carrier wafer. The carrier wafer may include a semiconductor wafer (such as a silicon wafer), a dielectric wafer (such as a glass wafer), or the like.

In some embodiments, the chip structure 102A is a semiconductor wafer that includes multiple semiconductor chips. After a sawing process, multiple semiconductor chips that are separated from each other may be obtained. In some other embodiments, the chip structure 102A is a single semiconductor chip.

In some embodiments, the chip structure 102A includes a semiconductor body 104. The semiconductor body may be a semiconductor substrate or a portion of a semiconductor substrate. In some embodiments, the semiconductor body 104 is a bulk semiconductor substrate, such as a semiconductor wafer. The semiconductor body 104 may include silicon or other elementary semiconductor materials such as germanium. The semiconductor body 104 may be doped (e.g., p-type, n-type, or a combination thereof). In some embodiments, the semiconductor body 104 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor body 104 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor body 104 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor body 104 includes a multi-layered structure. For example, the semiconductor body 104 includes a silicon-germanium layer formed on a bulk silicon layer.

Various device elements are formed in or over the semiconductor body 104. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other suitable processes.

In some embodiments, multiple dielectric layers 106*a* and multiple conductive features 108 are formed over the semiconductor body 104, as shown in FIG. 1A. The conductive features 108 are surrounded by the dielectric layers 106*a*. The conductive features 108 may include conductive contacts, conductive lines, and conductive vias. In some embodiments, some of the conductive features 108 form multiple protective ring structures 110. The protective ring structures 110 may be used to protect through semiconductor vias (TSVs) that will be formed later. The protective ring structures 110 may function as guard rings to prevent moisture from reaching the TSVs to negatively affect the TSVs. Each of the protective ring structures 110 may include multiple conductive lines and multiple conductive vias.

The dielectric layers 106*a* may be made of or include silicon oxide, silicon oxynitride, silicon nitride, carbon-containing silicon oxide, carbon-containing silicon nitride, carbon-containing silicon oxynitride, another suitable materials, or a combination thereof. The conductive features 108 may be made of or include copper, tungsten, cobalt, aluminum, another suitable material, or a combination thereof. The formation of the dielectric layers 106*a* and the conductive features 108 may involve multiple deposition processes, patterning processes, planarization processes, another applicable process, or a combination thereof.

The device elements of the chip structure 102A are interconnected by the conductive features 108 to form integrated circuit devices, such as logic devices, memory devices (e.g., static random access memory, SRAM), radio frequency (RF) devices, input/output (I/O) devices, a system-on-chip (SoC) device, one or more other types of devices, or a combination thereof.

Figure 1B:
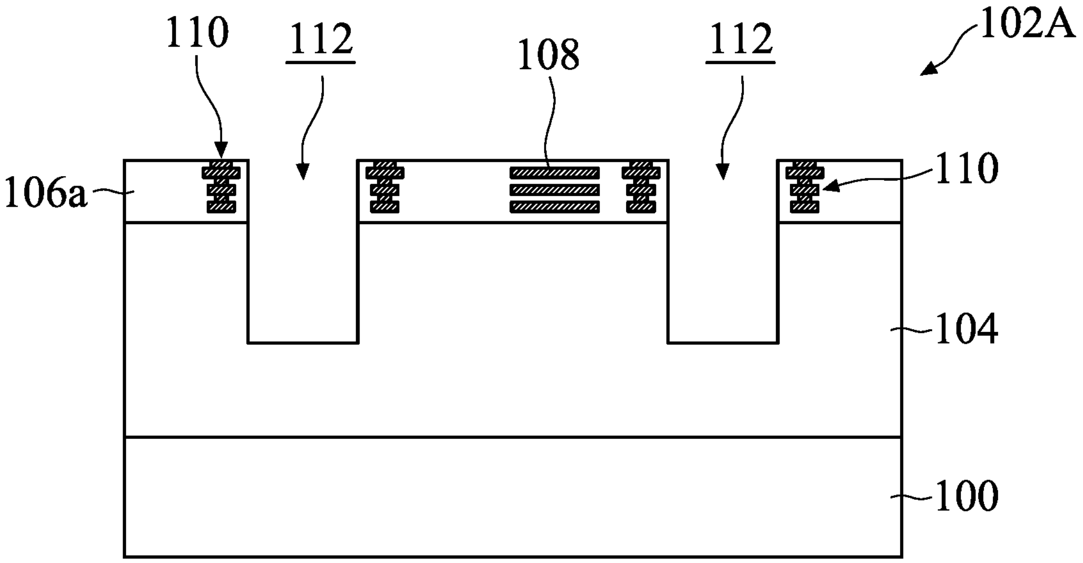

As shown in FIG. 1B, the dielectric layers 106*a* and the semiconductor body 104 are partially removed, in accordance with some embodiments. As a result, multiple openings 112 are formed. In some embodiments, upper portions of the openings 112 are laterally surrounded by the protective ring structures 110. In some embodiments, the openings 112 have vertical sidewalls. In some embodiments, the openings 112 have slanted sidewalls. One or more photolithography processes and one or more etching processes may be used to form the openings 112. The etching processes may include a wet etching process, a dry etching process, or a combination thereof.

In some embodiments, the semiconductor body 104 is doped with first-type dopants. In some embodiments, the semiconductor body 104 is p-type doped with one kind or multiple kinds of p-type dopants doped therein. For example, the semiconductor body 104 is a silicon substrate doped with boron or the like. In accordance with some embodiments, after the formation of the openings 112, second-type dopants (such as n-type dopants) are introduced into the semiconductor body 104, so as to form modified portions near the openings 112. In some embodiments, the second-type dopants are used to reduce the p-type dopant concentration of the modified portions. The amount of the second-type dopants is lower than the first-type dopants. The modified portions thus remain p-type doped.

Figure 1C:
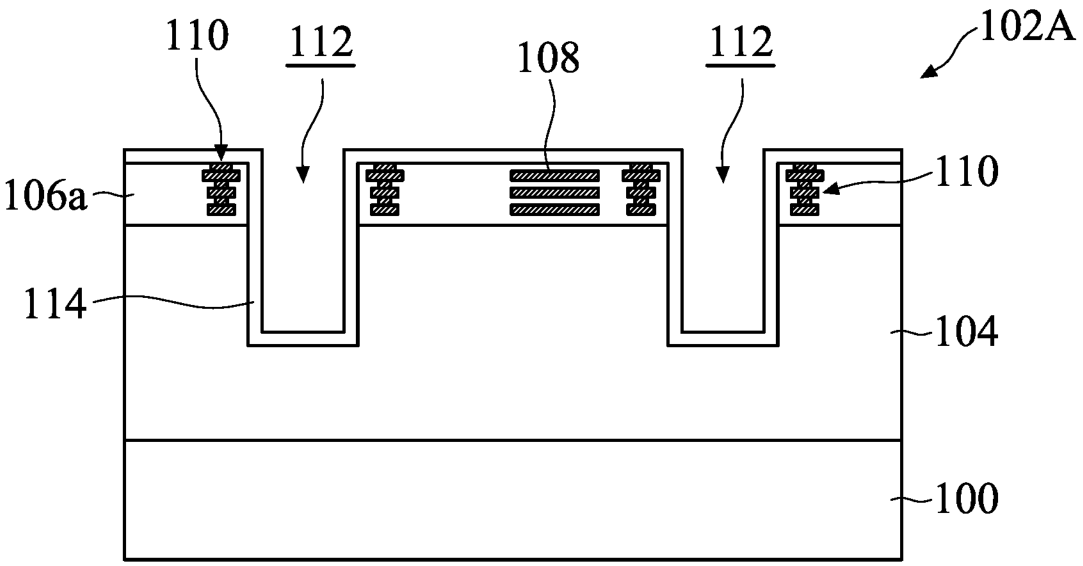

As shown in FIG. 1C, a dopant source layer 114 is deposited over the structure shown in FIG. 1B, in accordance with some embodiments. The dopant source layer 114 extends along the sidewalls and bottoms of the openings 112. In some embodiments, the dopant source layer 114 extends along the sidewalls and bottoms of the openings 112 in a conformal manner. In some embodiments, the dopant source layer 114 is in direct contact with the sidewalls and bottoms of the openings 112. The dopant source layer 114 may have a thickness that is within a range from about 1 μm to about 2 μm.

The dopant source layer 114 is used to provide the second-type dopants into the semiconductor body 104. In some embodiments, the semiconductor body 104 is p-type doped, and the dopant source layer 114 is used to providing one or more kinds of n-type dopants. The dopant source layer 114 may be used to provide phosphorus, arsenic, nitrogen, antimony, bismuth, another suitable n-type dopant, or a combination thereof. In some embodiments, the dopant source layer 114 is a phosphorus-containing layer such as a black phosphorus layer. The dopant source layer 114 may be deposited using a chemical vapor deposition (CVD) process, an atomic layer deposition (ALD) process, a spin coating process, another applicable process, or a combination thereof.

However, embodiments of the disclosure are not limited thereto. Many variations and/or modifications can be made to embodiments of the disclosure. In some other embodiments, the semiconductor body 104 is n-type doped, and the dopant source layer 114 is used to providing one or more kinds of p-type dopants.

Figure 1D:
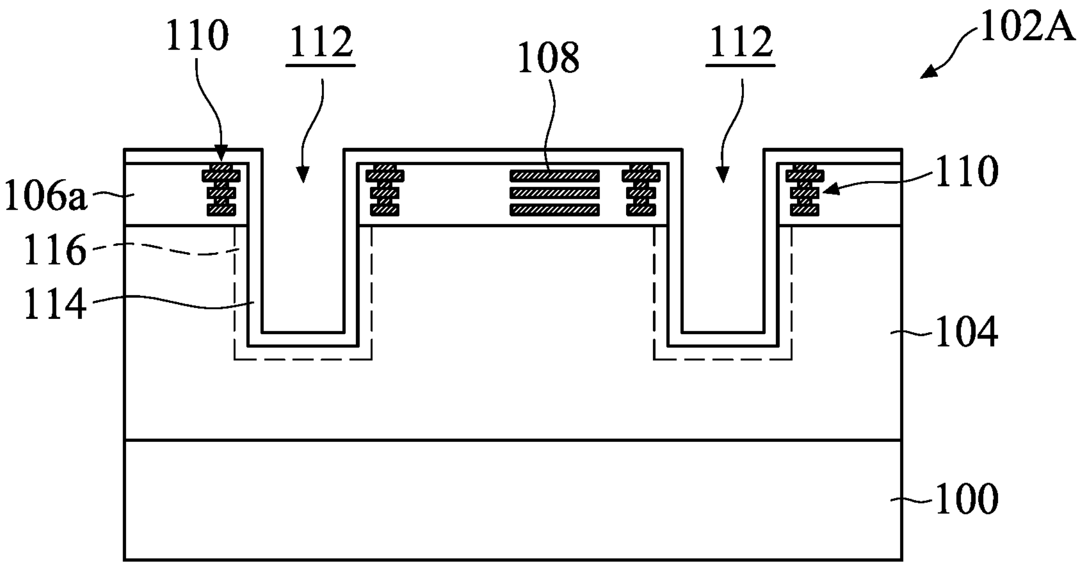

As shown in FIG. 1D, the semiconductor body 104 and the dopant source layer 114 are heated, in accordance with some embodiments. As a result, some of the second-type dopants (such as n-type dopants) from the dopant source layer 114 diffuse into the semiconductor body 104. The portions of the semiconductor body 104 that are around the openings 112 are thus doped with the second-type dopants. As a result, modified portions 116 are formed, as shown in FIG. 1D. In some embodiments, the semiconductor body 104 and the dopant source layer 114 are heated at a temperature that is within a range from about 300 degrees C. to about 500 degrees. The operation time is within a range from about 20 minutes to about 1 hour. For example, the semiconductor body 104 and the dopant source layer 114 are baked at about 400 degrees C. for about 30 minutes.

Due to the introduction of the second-type dopants, the dopant concentration of the first-type dopant in the modified portions 116 becomes lower. In some embodiments, the semiconductor body 104 is p-type doped, and the modified portions 116 are also p-type doped. The atomic concentration of the p-type dopants in the semiconductor body 104 is higher than the atomic concentration of the p-type dopants in the modified portions 116.

Figure 1E:
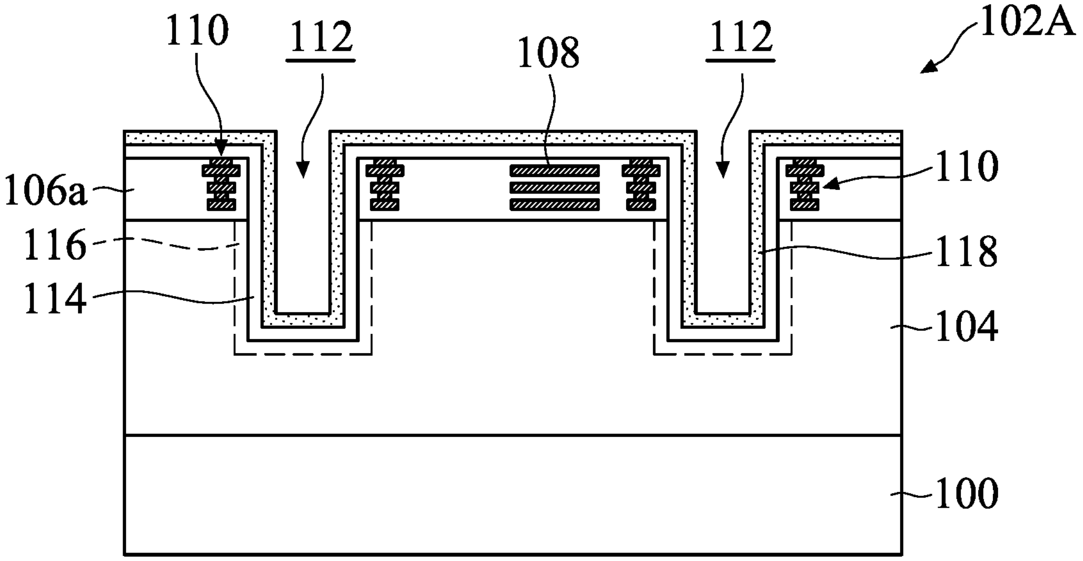

As shown in FIG. 1E, a dielectric layer 118 is deposited over the dopant source layer 114, in accordance with some embodiments. In some embodiments, the dielectric layer 118 is in direct contact with the dopant source layer 114. In some embodiments, the dielectric layer 118 extends along the sidewalls and bottoms of the openings 112. In some embodiments, the dielectric layer 118 extends along the sidewalls and bottoms of the openings 112 in a conformal manner. In some embodiments, the dielectric layer 118 is physically separated from the modified portions 116 of the semiconductor body 104 by the dopant source layer 114.

However, embodiments of the disclosure are not limited thereto. Many variations and/or modifications can be made to embodiments of the disclosure. In some other embodiments, after the semiconductor body 104 and the dopant source layer 114 are heated, the entirety of the dopant source layer 114 are introduced into the semiconductor body 104 to form the modified portions 116. As a result, the dopant source layer 114 disappears. In some embodiments, the dielectric layer 118 is thus in direct contact with the modified portions 116 of the semiconductor body 104.

The dielectric layer 118 may be made of or include silicon oxide, carbon-containing silicon oxide, silicon oxynitride, carbon-containing silicon oxynitride, silicon nitride, another suitable material, or a combination thereof. The dielectric layer 118 may be deposited using a CVD process, an ALD process, another applicable process, or a combination thereof.

Figure 1F:
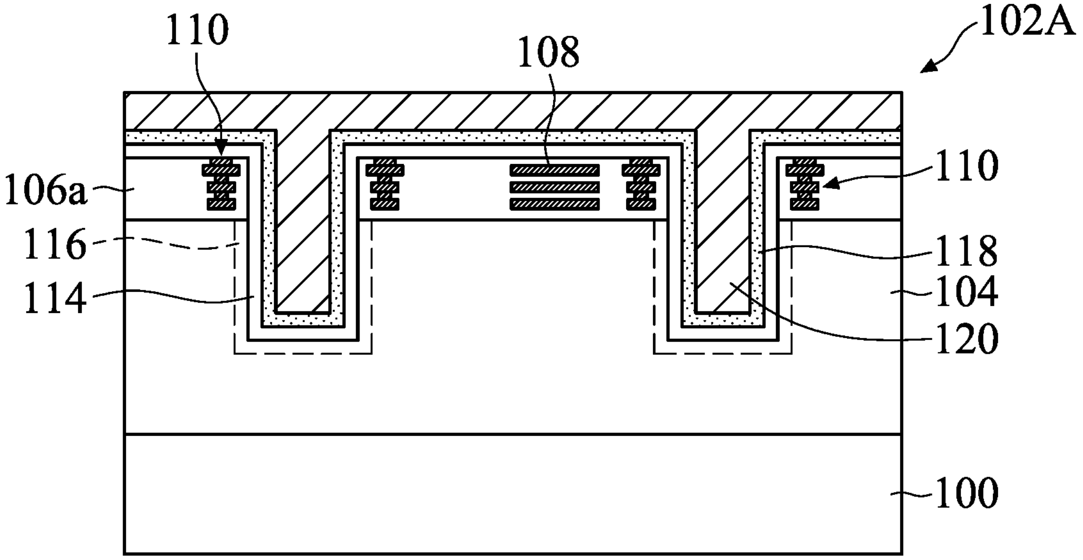

As shown in FIG. 1F, a conductive material layer 120 is formed over the dielectric layer 118, in accordance with some embodiments. In some embodiments, the conductive material layer 120 overfills the openings 112, as shown in FIG. 1F. The conductive material layer 120 may be made of or include copper, titanium, tungsten, aluminum, cobalt, gold, another suitable material, or a combination thereof. The conductive material layer 120 may be formed using an electroplating process, an electrochemical plating process, a CVD process, a physical vapor deposition (PVD) process, another applicable process, or a combination thereof.

In some embodiments, the conductive material layer 120 is formed using an electroplating process. A barrier layer and a seed layer may be sequentially deposited over the dielectric layer 118. The barrier layer may be made of or include titanium, titanium nitride, tantalum nitride, another suitable material, or a combination thereof. The seed layer may be made of or include copper. Afterwards, an electroplating process is used to form conductive material on the seed layer. As a result, the conductive material layer 120 is formed.

Figure 1G:
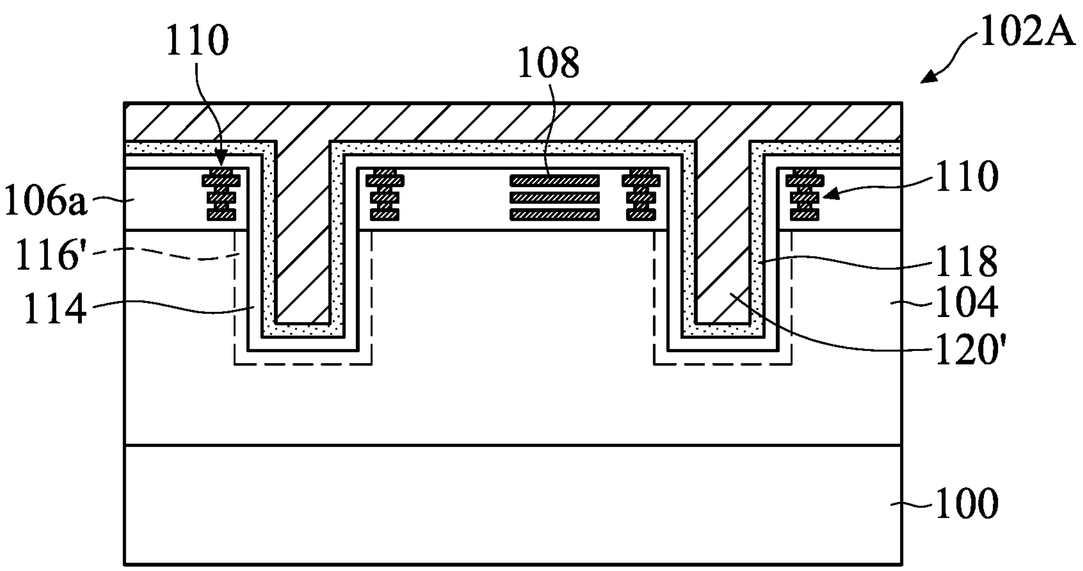

As shown in FIG. 1G, a thermal annealing process is used to treat the conductive material layer 120, in accordance with some embodiments. As a result, a conductive layer 120' is formed. After the thermal annealing process, the quality of the conductive layer 120' is improved. The operation temperature of the thermal annealing process may be within a range from about 300 degrees C. to about 500 degrees. The operation time of the thermal annealing process is within a range from about 20 minutes to about 1 hour. For example, the conductive material layer 120 is annealed at about 400 degrees C. for about 30 minutes.

In some embodiments, during the thermal annealing process, a more amount of the second-type dopants from the dopant source layer 114 is introduced into the semiconductor body. As a result, the modified portions 116 are further modified to form modified portions 116'. In some embodiments, the atomic concentration of p-type dopants in the modified portions 116' is further reduced. In some embodiments, the modified portions 116' remain p-type doped.

Figure 1H:
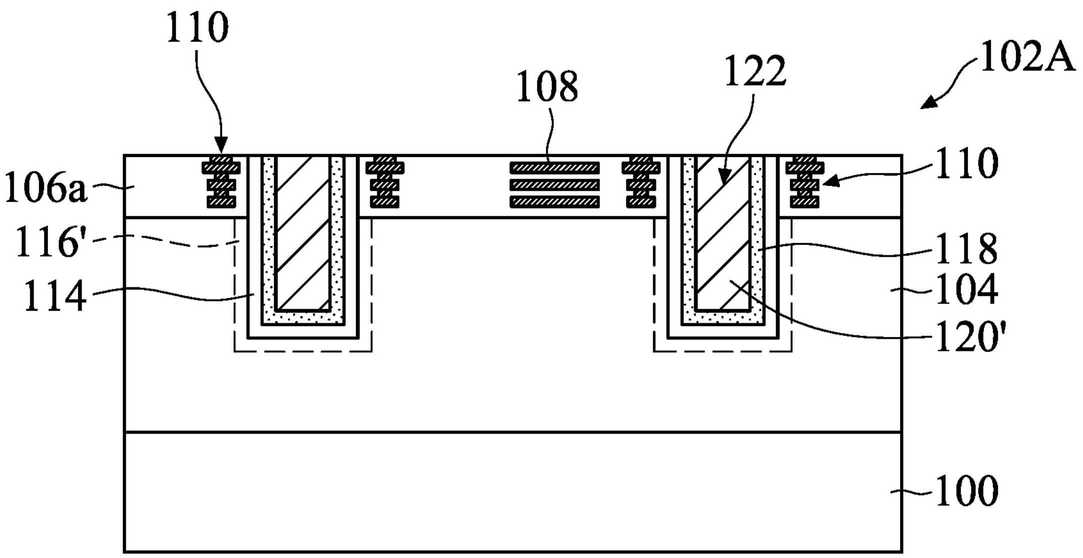

As shown in FIG. 1H, a planarization process is used to partially remove the dopant source layer 114, the dielectric layer 118, and the conductive layer 120', in accordance with some embodiments. The portions of the dopant source layer 114, the dielectric layer 118, and the conductive layer 120' that are outside of the openings 112 are thus removed. As a result, the remaining portions of the conductive layer 120' form conductive structures 122, as shown in FIG. 1H. The planarization process may include a chemical mechanical polishing (CMP) process, a grinding process, an etching process, another applicable process, or a combination thereof.

Figure 1I:
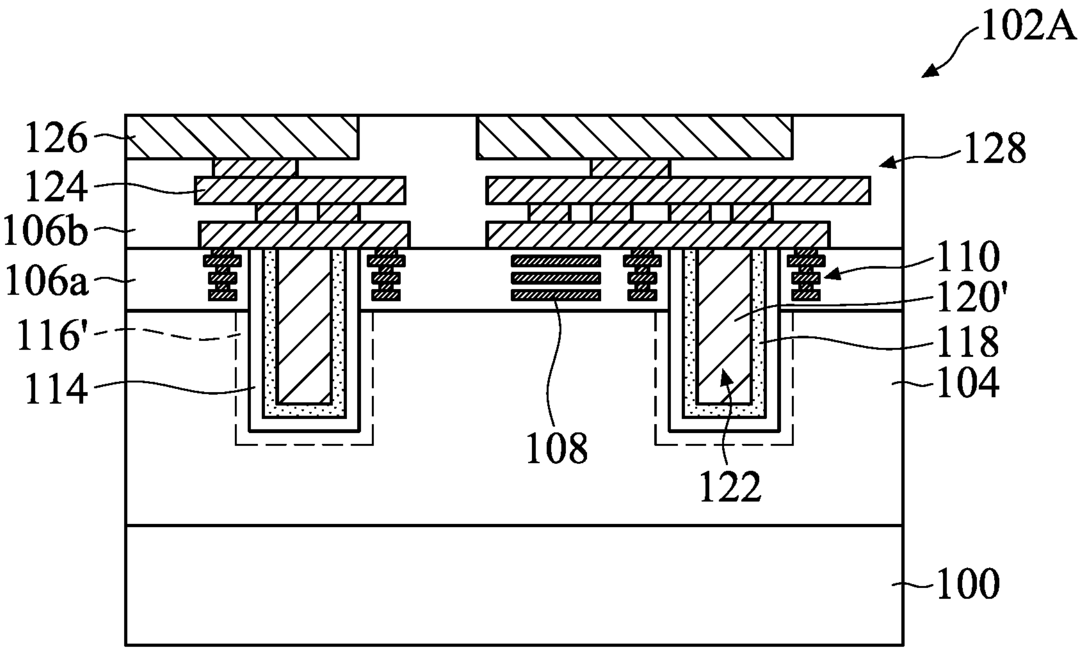

As shown in FIG. 1I, multiple dielectric layers **106*b* and multiple conductive features 124 and 126 are formed, in accordance with some embodiments. The dielectric layers 106*a* and 106*b* and the conductive features 108, 124, and 126 together form a front-side interconnection structure 128. Each of the conductive structures 122 may be electrically connected to one or more of the conductive features 108 and 124 formed in the front-side interconnection structure 128**.

The conductive features 126 of the front-side interconnection structure 128 may be made of or include copper, aluminum, another suitable material, or a combination thereof. In some embodiments, the conductive features 126 function as conductive pads or redistribution layers. Each of the conductive features 126 may be electrically connected to one or more of the conductive features 124 thereunder. In some embodiments, each of the conductive features 126 is thicker than each of the conductive features 124 thereunder. Each of the conductive features 126 may have a thickness that is within a range from about 2.5 μm to about 4.5 μm. Top metals of the conductive features 124 may have a thickness that is within a range from about 0.5 μm to about 1 μm.

Figure 1J:
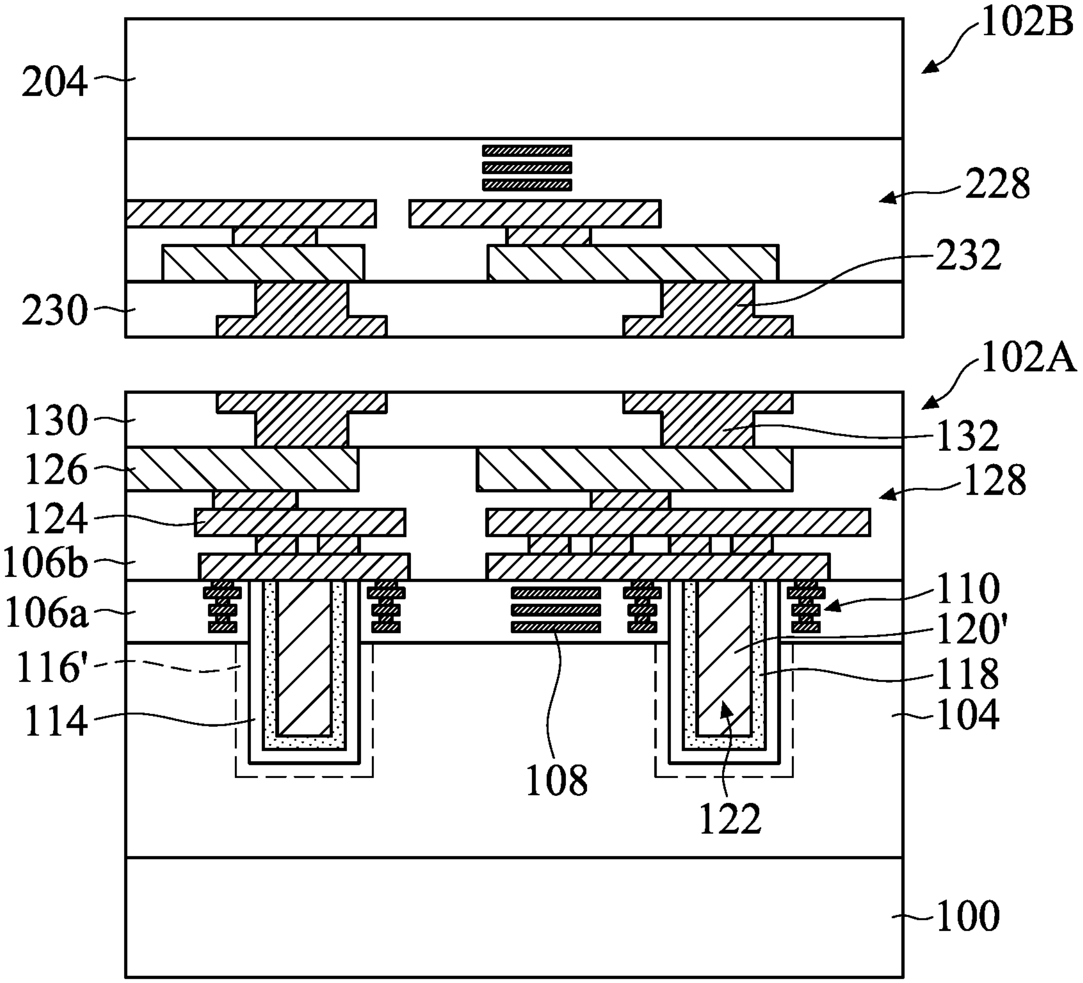

As shown in FIG. 1J, a dielectric bonding structure 130 and multiple conductive bonding structures 132 are formed over the front-side interconnection structure 128, in accordance with some embodiments. The dielectric bonding structure 130 may be made of or include silicon oxide, carbon-containing silicon oxide, silicon oxynitride, another suitable material, or a combination thereof. The dielectric bonding structure 130 may be deposited using a CVD process or the like.

In some embodiments, the conductive bonding structures 132 penetrate through the dielectric bonding structure 130. In some embodiments, the conductive bonding structures 132 are electrically connected to the conductive features 126. Each of the conductive bonding structures 132 includes a metal bonding structure and a conductive via.

In some embodiments, the top surfaces of the dielectric bonding structure 130 and the conductive bonding structures 132 are coplanar, as shown in FIG. 1J. In some embodiments, the formation of the conductive bonding structures 132 involves one or more planarization processes, so as to ensure that top surfaces of the dielectric bonding structure 130 and the conductive bonding structures 132 are coplanar. For example, a chemical mechanical polishing (CMP) process is used.

Afterwards, a chip structure (or a chip-containing structure) 102B is picked up and ready to be bonded to the chip structure 102A, as shown in FIG. 1J in accordance with some embodiments. In some embodiments, the chip structure 102B is a semiconductor wafer that includes multiple semiconductor chips. After a sawing process, multiple semiconductor chips that are separated from each other may be obtained. In some other embodiments, the chip structure 102B is a single semiconductor chip.

In some embodiments, similar to the chip structure 102A, the chip structure 102B includes a semiconductor body 204 with multiple device elements formed therein or thereon. The chip structure 102B also includes a front-side interconnection structure 228. Similar to the front-side interconnection structure 128 of the chip structure 102A, the front-side interconnection structure 228 includes multiple dielectric layers that laterally surround multiple conductive features.

In some embodiments, a dielectric bonding structure 230 and multiple conductive bonding structures 232 are formed on the front-side interconnection structure 228 of the chip structure 102B. Similar to the conductive bonding structures 132, in some embodiments, each of the conductive bonding structures 232 includes a metal bonding structure and a conductive via.

Figure 1K:
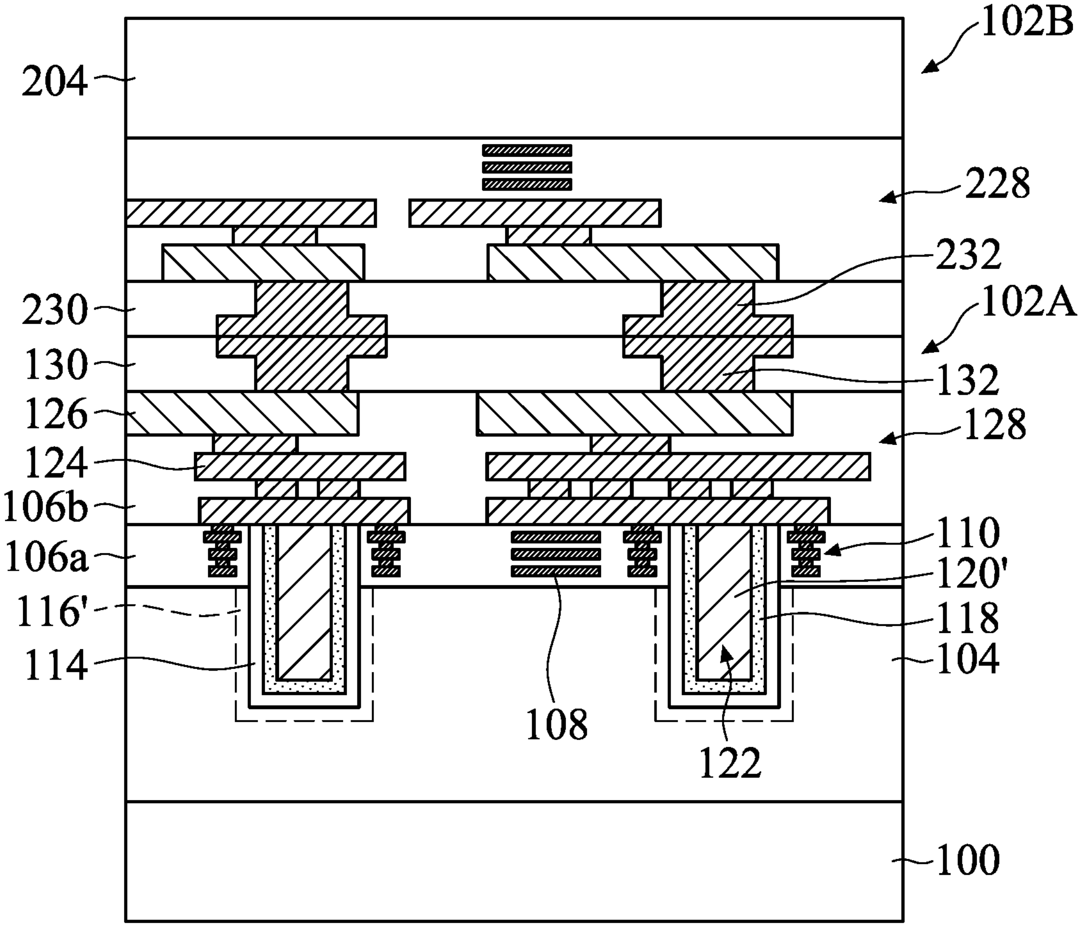

As shown in FIG. 1K, the chip structures 102A and 102B are bonded together through direct bonding, in accordance with some embodiments. The direct bonding may be a hybrid bonding that includes metal-to-metal bonding (i.e., the bonding between the conductive bonding structures 132 and 232) and dielectric-to-dielectric bonding (i.e., the bonding between the dielectric bonding structures 130 and 230). In some embodiments, there is no tin-containing solder elements formed between the chip structures 102A and 102B.

In some embodiments, the chip structure 102B is placed directly on the dielectric bonding structure 130 and the conductive bonding structures 132. As a result, the dielectric bonding structure 130 of the chip structure 102A is in direct contact with the dielectric bonding structure 230 of the chip structure 102B. The conductive bonding structures 132 of the chip structure 102A are in direct contact with the conductive bonding structures 232 of the chip structure 102B.

Before the placing of the chip structure 102B, planarization processes are performed, so as to provide highly planarized bonding surfaces. In some embodiments, there is no gap between the dielectric bonding structures 130 and 230. In some embodiments, there is no gap between the conductive bonding structures 132 and 232. In some embodiments, a thermal operation is then used to enhance the bonding between the conductive bonding structures 132 and 232. The temperature of the thermal operation may within a range from about 100 degrees C. to about 500 degrees C.

Figure 1L:
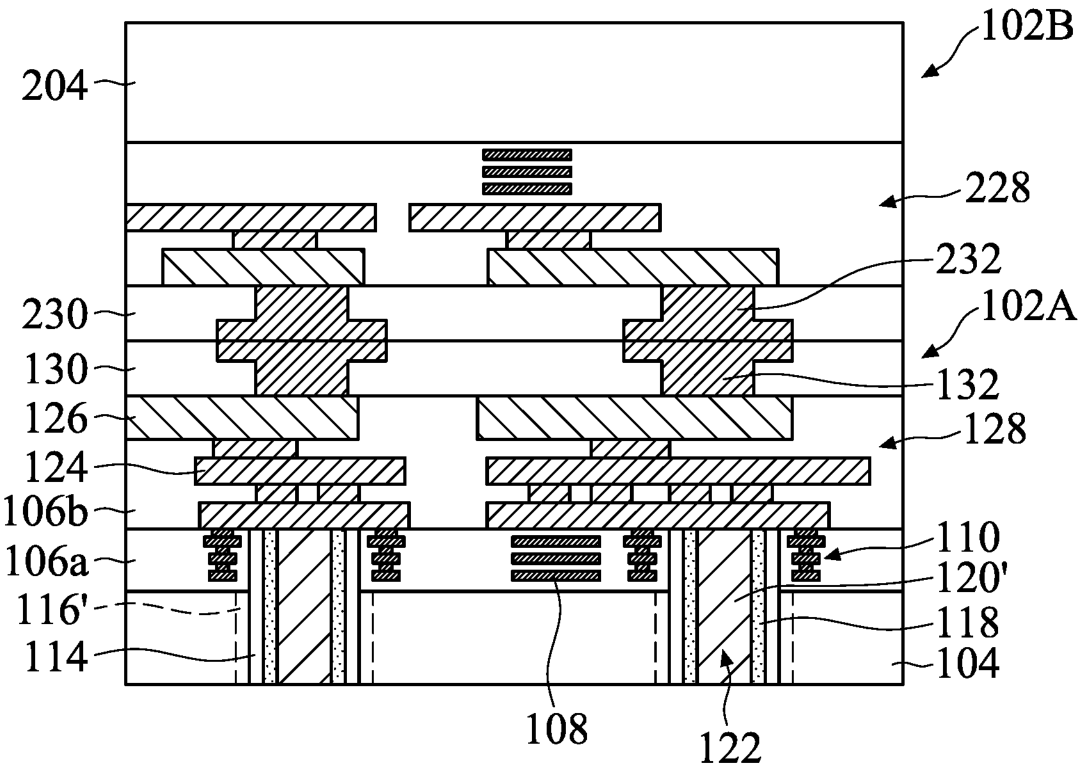

As shown in FIG. 1L, the carrier substrate 100 is removed, in accordance with some embodiments. The chip structure 102A is then thinned using a planarization process. The planarization process may include a CMP process, a grinding process, an etching process, another applicable process, or a combination thereof. As a result, the conductive structures 122 that are originally covered by the semiconductor body 104 are exposed. In some embodiments, the semiconductor body 104 is etched back so that the conductive structures 122 protrude from the bottom surface of the chip structure 102A.

Figure 1M:
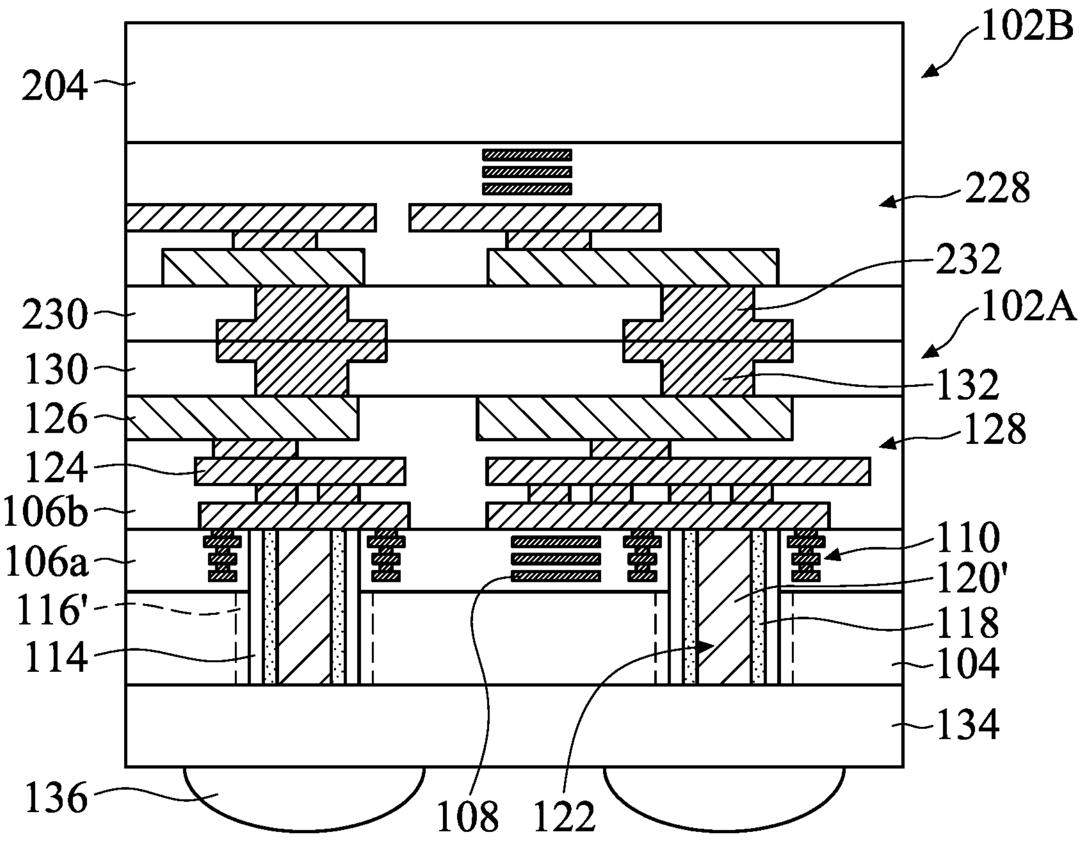

As shown in FIG. 1M, a redistribution structure that includes multiple insulating layers and multiple conductive features is formed over the semiconductor body 104 and the conductive structures 122, in accordance with some embodiments. The formation of the redistribution structure may involve multiple film formation processes, multiple patterning processes, multiple planarization processes, another applicable process, or a combination thereof.

The insulating layers of the redistribution structure 134 may be made of or include a polymer material. The polymer material may be made of or include polybenzoxazole (PBO), polyimide, epoxy-based resin, another suitable polymer material, or a combination thereof. In some other embodiments, the insulating layers are made of or include silicon nitride, silicon oxide, silicon oxynitride, silicon carbide, another suitable dielectric material, or a combination thereof. In some embodiments, the formation of each of the insulating layers involves a spin-on process, a spray coating process, a chemical vapor deposition (CVD) process, another applicable process, or a combination thereof.

The conductive features of the redistribution structure 134 may be made of or include copper, titanium, aluminum, gold, platinum, cobalt, tungsten, another suitable material, or a combination thereof. The formation of each of the conductive features may involve using an electroplating process, an electrochemical plating process, a CVD process, a physical vapor deposition (PVD) process, another applicable process, or a combination thereof.

Afterwards, conductive bumps 136 are formed, as shown in FIG. 1M in accordance with some embodiments. The conductive bumps 136 may include a solder material. The solder material may be a tin-containing material. The tin-containing material may further include copper, silver, gold, aluminum, lead, one or more other suitable materials, or a combination thereof. In some other embodiments, the solder material is lead-free.

In some embodiments, a sawing process is used to separate the structure into multiple semiconductor device structures or package structures. One of the semiconductor device structures or package structures is shown in FIG. 1M. The semiconductor device structures or package structure may function as a system on integrated chips (SoIC) that may further be integrated into a chip on wafer on substrate (CoWoS) package structure, an integrated fan-out (InFO) package structure, or the like.

In some embodiments, the conductive structures 122 completely penetrate through the semiconductor body 104. The conductive structures 122 may thus function as through semiconductor vias (TSVs) or through chip vias.

In order to enhance heat dissipation of the semiconductor device structure shown in FIG. 1M, the semiconductor body 104 may be formed to have a sufficient thickness of about 50 μm. As a result, high capacitance may thus be formed between the conductive structures 122 and the semiconductor body 104. The operation speed of the semiconductor device structure may be negatively affected. Due to the modified portions 116' that surround the conductive structures 122, the capacitance caused by the conductive structures 122 is significantly reduced. The operation speed and heat dissipation of the semiconductor device structure may thus be improved. The reliability and performance of the semiconductor device structure are greatly improved.

Figure 2:
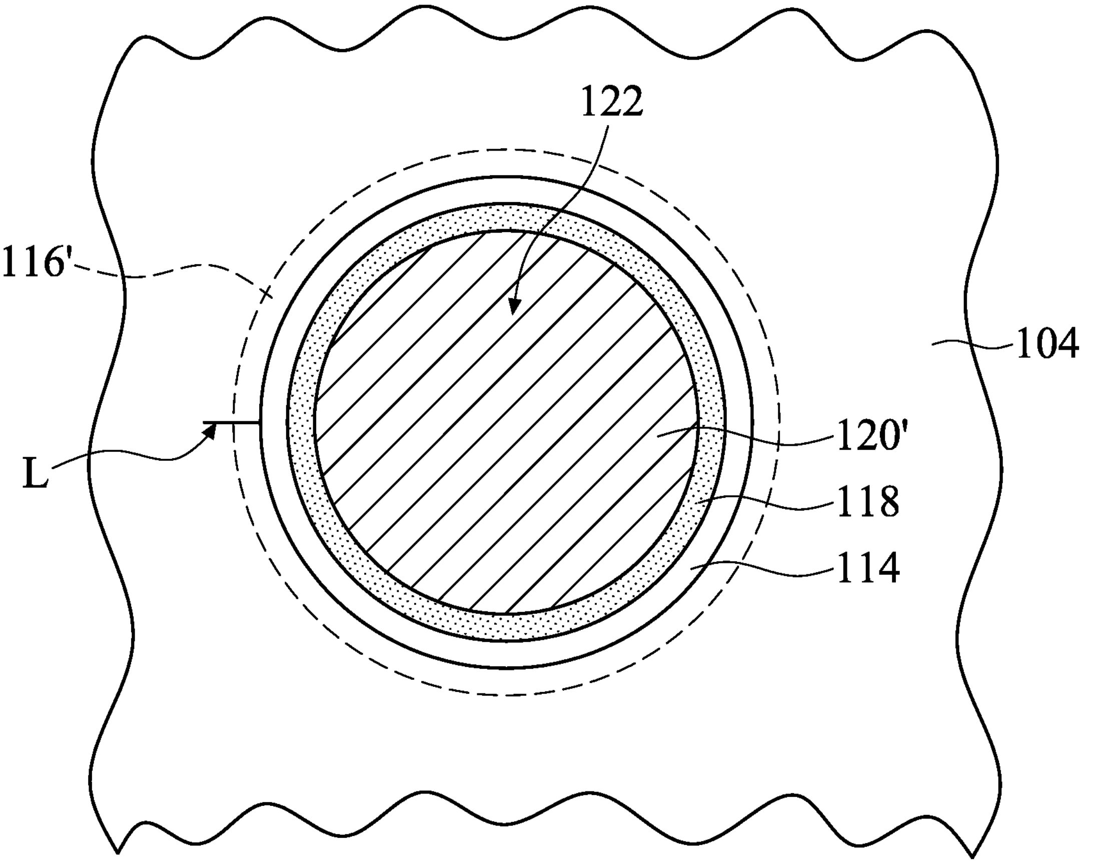
FIG. 2 is a cross-sectional view of a portion of a semiconductor device structure, in accordance with some embodiments.

FIG. 2 is a cross-sectional view of a portion of a semiconductor device structure, in accordance with some embodiments. In some embodiments, FIG. 2 is a plan view showing the structure near one of the conductive structures 122 shown in FIG. 1M. In some embodiments, as shown in FIG. 2, the conductive structure 122 is continuously surrounded by the dielectric layer 118. The dielectric layer 118 and the conductive structure 122 are continuously surrounded by the dopant source layer 114. The dopant source layer 114, the dielectric layer 118, and the conductive structure 122 are continuously surrounded by the modified portion 116' of the semiconductor body 104.

Figure 3:
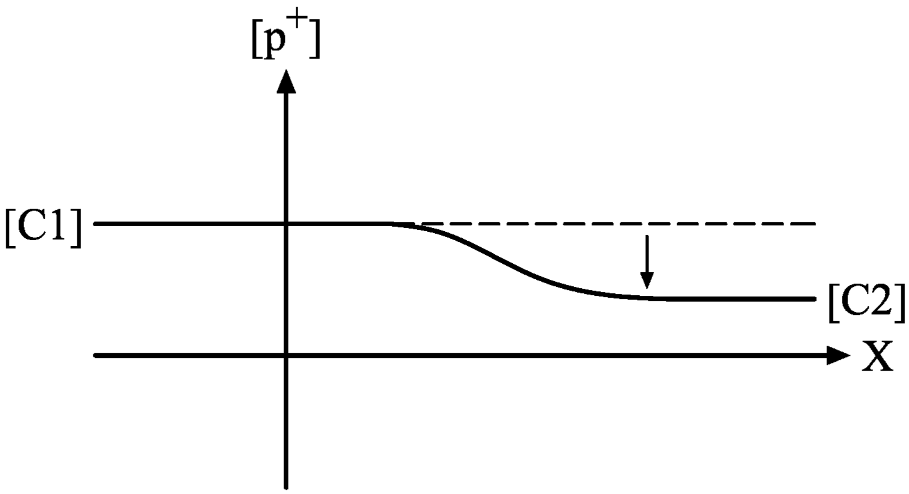
FIG. 3 is a diagram showing the dopant concentration of a portion of a semiconductor device structure, in accordance with some embodiments.

FIG. 3 is a diagram showing the dopant concentration of a portion of a semiconductor device structure, in accordance with some embodiments. In some embodiments, FIG. 3 is a diagram showing the dopant concentration of the semiconductor device structure along the imaginary line L in FIG. 2.

In some embodiments, the semiconductor body 104 that is not modified has a first atomic concentration of p-type dopants ([C1]). The modified portion 116' has a second atomic concentration of p-type dopants ([C2]). In some embodiments, the first atomic concentration of p-type dopants is greater than the second atomic concentration of p-type dopants, as shown in FIG. 3. The ratio ([C1]/[C2]) of the first atomic concentration of p-type dopants to the second atomic concentration of p-type dopants may be within a range from about 0.8 to about 0.9. In some embodiments, the second atomic concentration of p-type dopants of the modified portion 116' gradually becomes smaller along a direction towards the conductive structure 122, as shown in FIGS. 2 and 3.

In some embodiments, the second-type dopants are introduced into the semiconductor body through the dopant source layer. However, embodiments of the disclosure are not limited thereto. Many variations and/or modifications can be made to embodiments of the disclosure. In some other embodiments, the semiconductor body is exposed under an atmosphere that contains the second-type dopants, so as to introduce the second-type dopants into the semiconductor body.

Figure 4A:
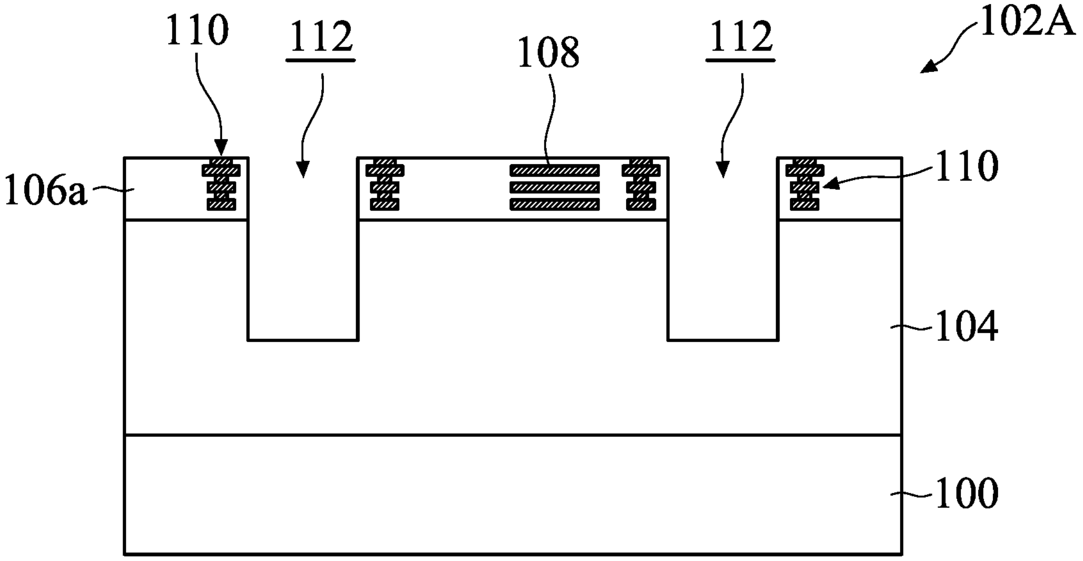
FIGS. 4A-4H are cross-sectional views of various stages of a process for forming a portion of a semiconductor device structure, in accordance with some embodiments.

FIGS. 4A-4H are cross-sectional views of various stages of a process for forming a portion of a semiconductor device structure, in accordance with some embodiments. As shown in FIG. 4A, a structure that is the same as or similar to the structure shown in FIG. 1B is formed.

Figure 4B:
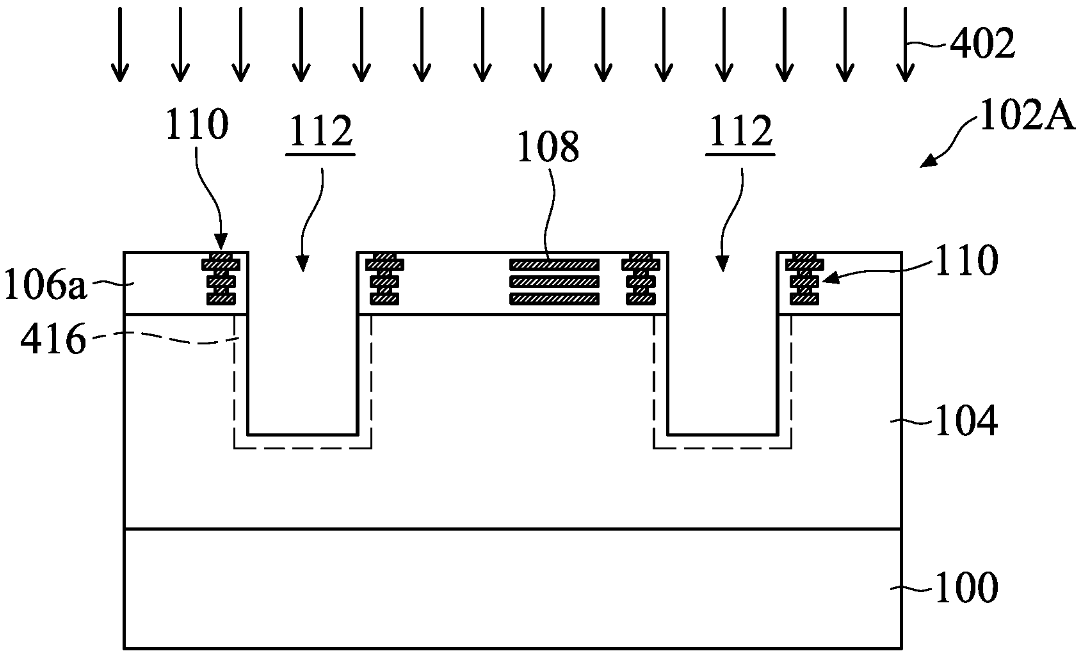

Afterwards, the semiconductor body 104 is modified using a modification operation 402, so as to form modified portions 416, as shown in FIG. 4B in accordance with some embodiments. The modification operation 402 may include introducing n-type dopant gas and/or n-type dopant ions into the openings 112. An atmosphere that contains n-type dopants is thus formed. As a result, the n-type dopants that reach the sidewalls and bottoms of the openings 112 may enter the semiconductor body 104. As a result, the portions of the semiconductor body 104 that surround the openings 112 are modified by the n-type dopants. Multiple modified portions 416 are thus formed. The modified portions 416 may be similar to the modified portions 116 shown in FIG. 1D.

Figure 4C:
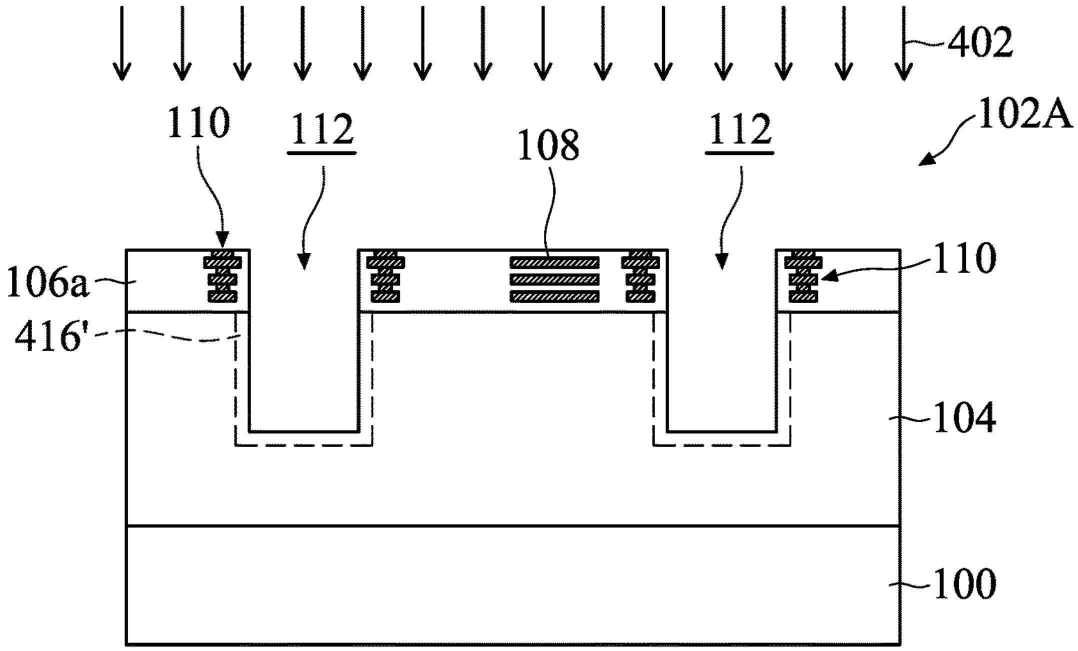

As shown in FIG. 4C, the semiconductor body 104 is heated, in accordance with some embodiments. As a result, more of the n-type dopants from the atmosphere diffuse into the semiconductor body 104. The modified portions 416 are thus doped with more n-type dopants. As a result, modified portions 416' are formed, as shown in FIG. 4C. In some embodiments, the semiconductor body 104 is heated while the semiconductor body 104 is exposed to the modification operation 402. The operation temperature is within a range from about 300 degrees C. to about 500 degrees. The operation time is within a range from about 20 minutes to about 1 hour. For example, the semiconductor body 104 baked under the n-type dopant containing atmosphere at about 400 degrees C. for about 30 minutes.

Figure 4D:
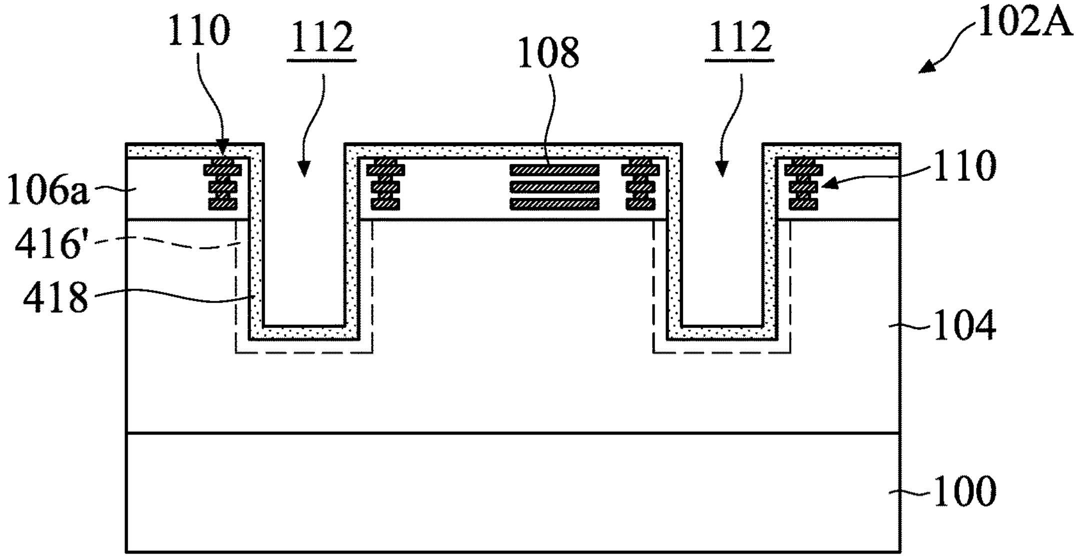

As shown in FIG. 4D, a dielectric layer 418 is deposited over the structure shown in FIG. 4C, in accordance with some embodiments. The dielectric layer 418 extends along the sidewalls and bottoms of the openings 112. In some embodiments, the dielectric layer 418 extends along the sidewalls and bottoms of the openings 112 in a conformal manner. In some embodiments, the dielectric layer 418 is in direct contact with the modified portions 416' of the semiconductor body 104. The material and formation method of the dielectric layer 418 may be the same as or similar to those of the dielectric layer 118 shown in FIG. 1E.

Figure 4E:
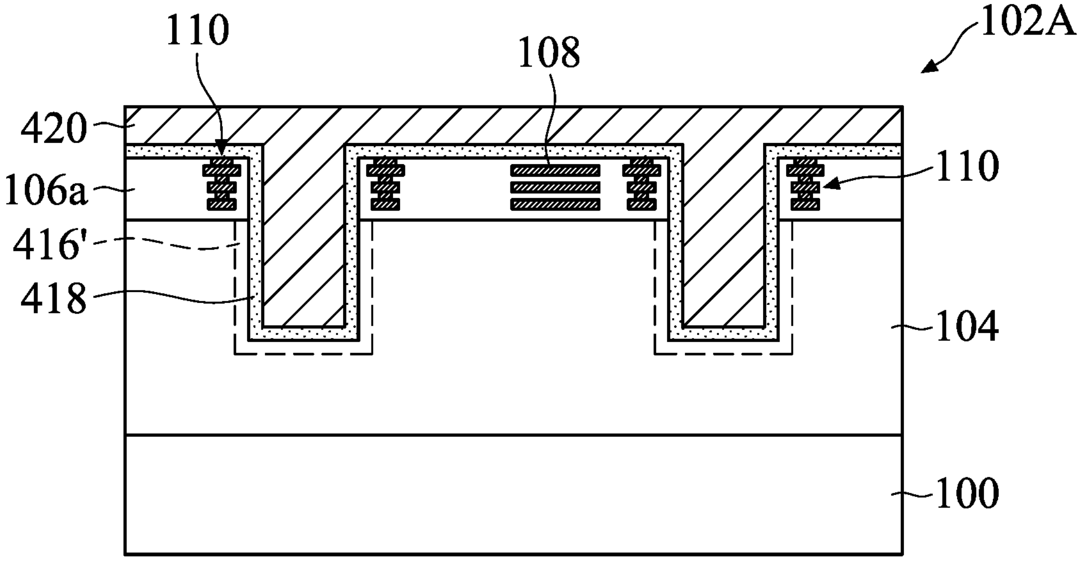

As shown in FIG. 4E, a conductive material layer 420 is formed over the dielectric layer 418 to fill the openings 112, in accordance with some embodiments. The material and formation method of the conductive material layer 420 may be the same as or similar to those of the conductive material layer 120 shown in FIG. 1F.

Figure 4F:
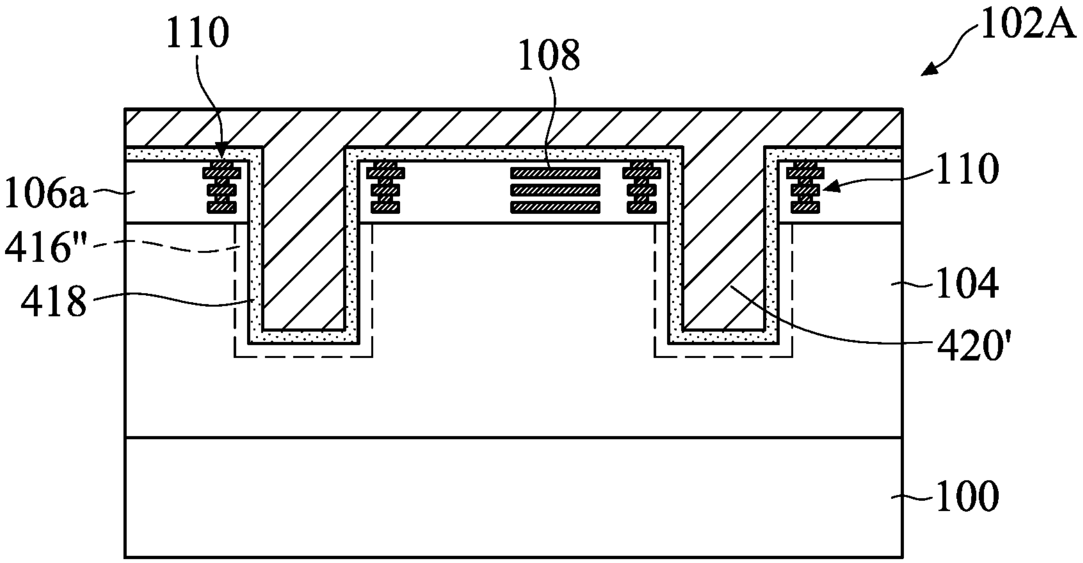

As shown in FIG. 4F, similar to the embodiments shown in FIG. 1G, a thermal annealing process is used to treat the conductive material layer 420, in accordance with some embodiments. As a result, a conductive layer 420' is formed. After the thermal annealing process, the quality of the conductive layer 420' is improved. The operation temperature of the thermal annealing process may be within a range from about 300 degrees C. to about 500 degrees. The operation time of the thermal annealing process is within a range from about 20 minutes to about 1 hour. For example, the conductive material layer 420 is annealed at about 400 degrees C. for about 30 minutes.

In some embodiments, during the thermal annealing process, n-type dopants in the modified portions 416' diffuse deeper into the semiconductor body 104. As a result, n-type dopants in the modified portions 416' are redistributed and form into modified portions 416", as shown in FIG. 4F. In some embodiments, the p-type dopants in the modified portions 416" are more than the n-type dopants in the modified portions 416". Therefore, the modified portions 416" remain p-type doped.

Figure 4G:
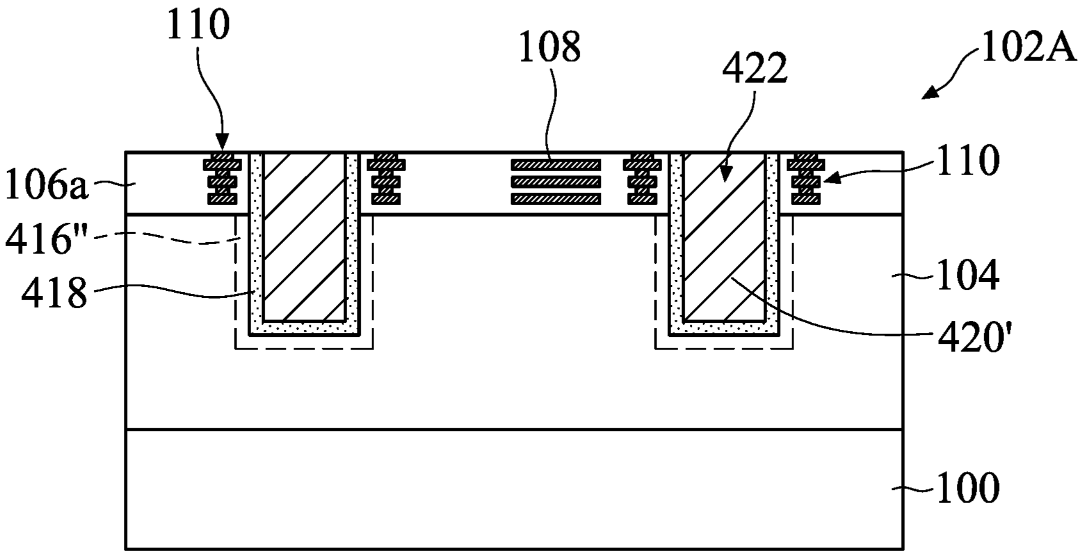

As shown in FIG. 4G, a planarization process is used to partially remove the dielectric layer 418 and the conductive layer 420', in accordance with some embodiments. The portions of the dielectric layer 418 and the conductive layer 420' that are outside of the openings 112 are thus removed. As a result, the remaining portions of the conductive layer 420' form multiple conductive structures 422, as shown in FIG. 4G. The planarization process may include a chemical mechanical polishing (CMP) process, a grinding process, an etching process, another applicable process, or a combination thereof.

Figure 4H:
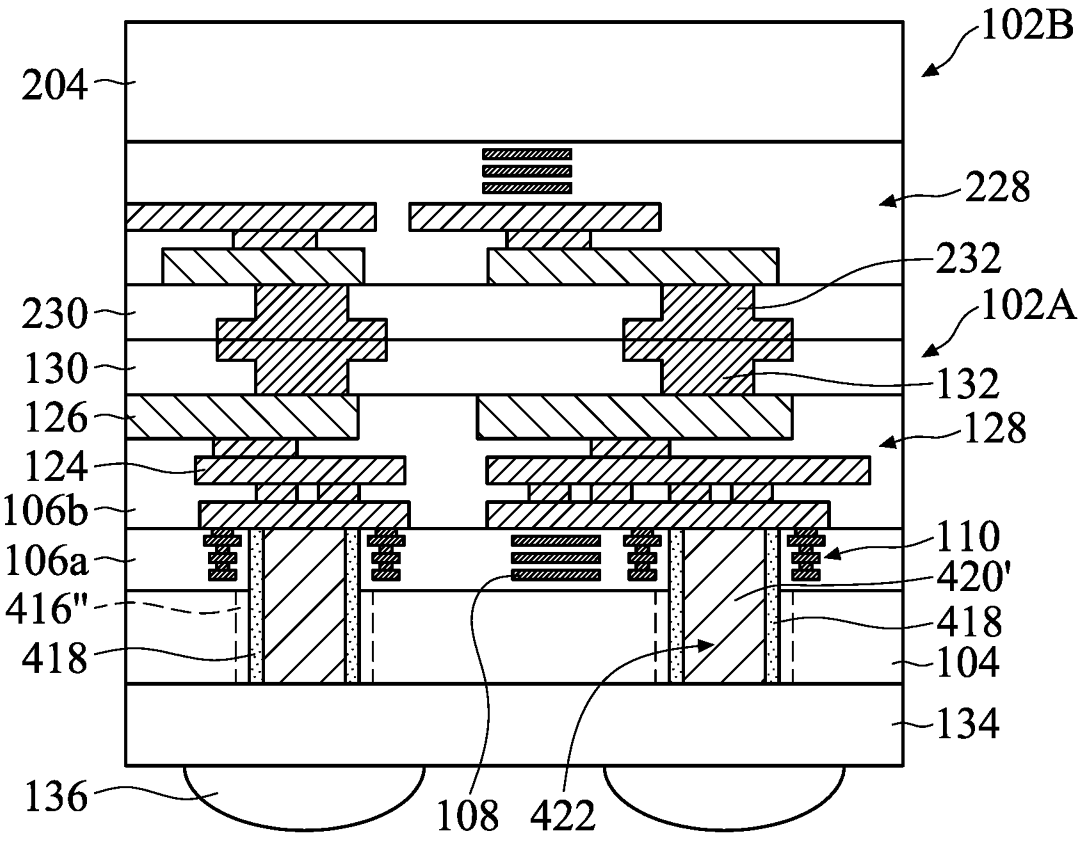

Afterwards, multiple processes that are the same as or similar to those illustrated in the embodiments shown in FIGS. 1I-1M are performed. As a result, the structure shown in FIG. 4H is formed, in accordance with some embodiments.

In some embodiments, a sawing process is used to separate the structure into multiple semiconductor device structures or package structures. One of the semiconductor device structures or package structures is shown in FIG. 4H. The semiconductor device structures or package structure may function as a system on integrated chips (SoIC) that may further be integrated into a chip on wafer on substrate (CoWoS) package structure, an integrated fan-out (InFO) package structure, or the like.

In some embodiments, the conductive structures 422 completely penetrate through the semiconductor body 104. The conductive structures 422 may thus function as through semiconductor vias (TSVs) or through chip vias. Due to the modified portions 416" that surround the conductive structures 422, the capacitance caused by the conductive structures 422 is significantly reduced. The operation speed and heat dissipation of the semiconductor device structure may thus be improved. The reliability and performance of the semiconductor device structure are greatly improved.

Figure 5:
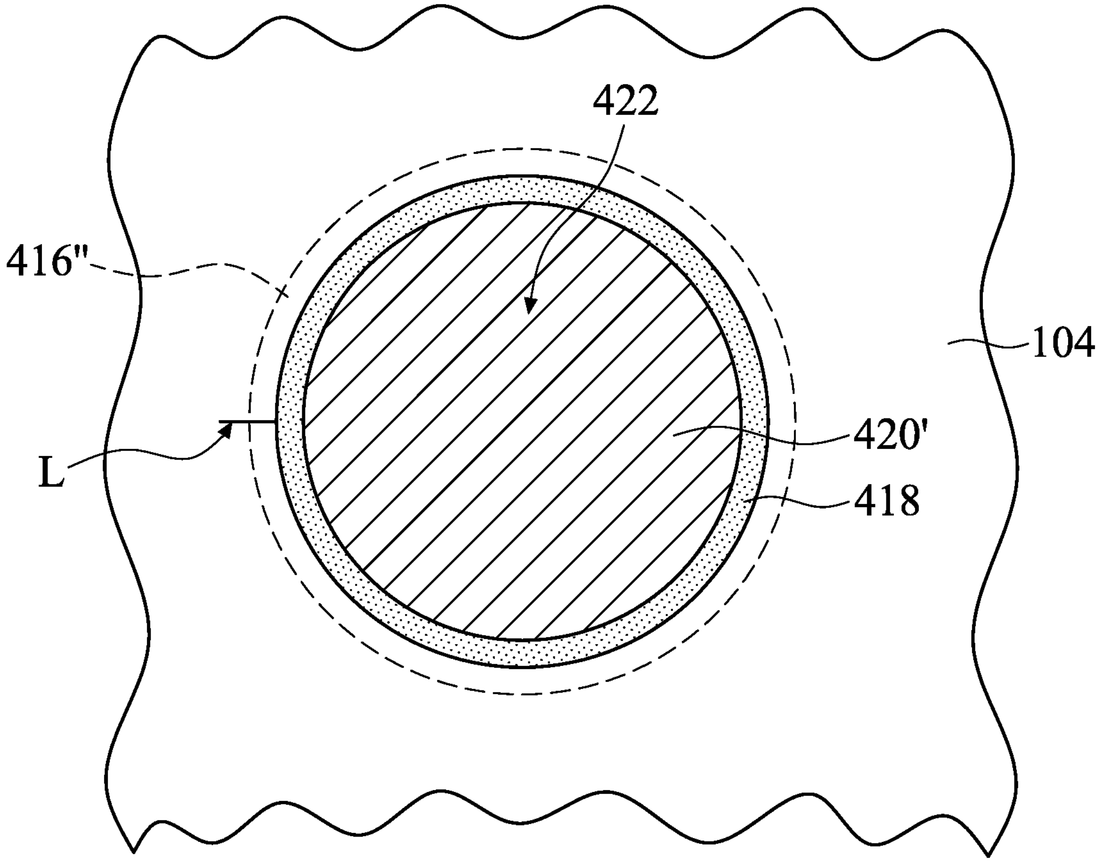
FIG. 5 is a cross-sectional view of a portion of a semiconductor device structure, in accordance with some embodiments.

FIG. 5 is a cross-sectional view of a portion of a semiconductor device structure, in accordance with some embodiments. In some embodiments, FIG. 5 is a plan view showing the structure near one of the conductive structures 422 shown in FIG. 4H. In some embodiments, as shown in FIG. 5, the conductive structure 422 is continuously surrounded by the dielectric layer 418. The dielectric layer 418 and the conductive structure 422 are continuously surrounded by the modified portion 416" of the semiconductor body 104.

In some embodiments, FIG. 3 is a diagram showing the dopant concentration of the semiconductor device structure along the imaginary line L in FIG. 5. In some embodiments, the semiconductor body 104 that is not modified has a first atomic concentration of p-type dopants ([C1]). The modified portion 416" has a second atomic concentration of p-type dopants ([C2]). In some embodiments, the first atomic concentration of p-type dopants is greater than the second atomic concentration of p-type dopants, as shown in FIG. 3. The ratio ([C1]/[C2]) of the first atomic concentration of p-type dopants to the second atomic concentration of p-type dopants may be within a range from about 0.8 to about 0.9. In some embodiments, the second atomic concentration of p-type dopants of the modified portion 416" gradually becomes smaller along a direction towards the conductive structure 422, as shown in FIGS. 5 and 3.

In some embodiments, the semiconductor device structure or the package structure is formed using a wafer-on-wafer (WoW) process. However, embodiments of the disclosure are not limited thereto. Many variations and/or modifications can be made to embodiments of the disclosure. In some embodiments, the semiconductor device structure or the package structure is formed using a chip-on-wafer (CoW) process.

Figure 6A:
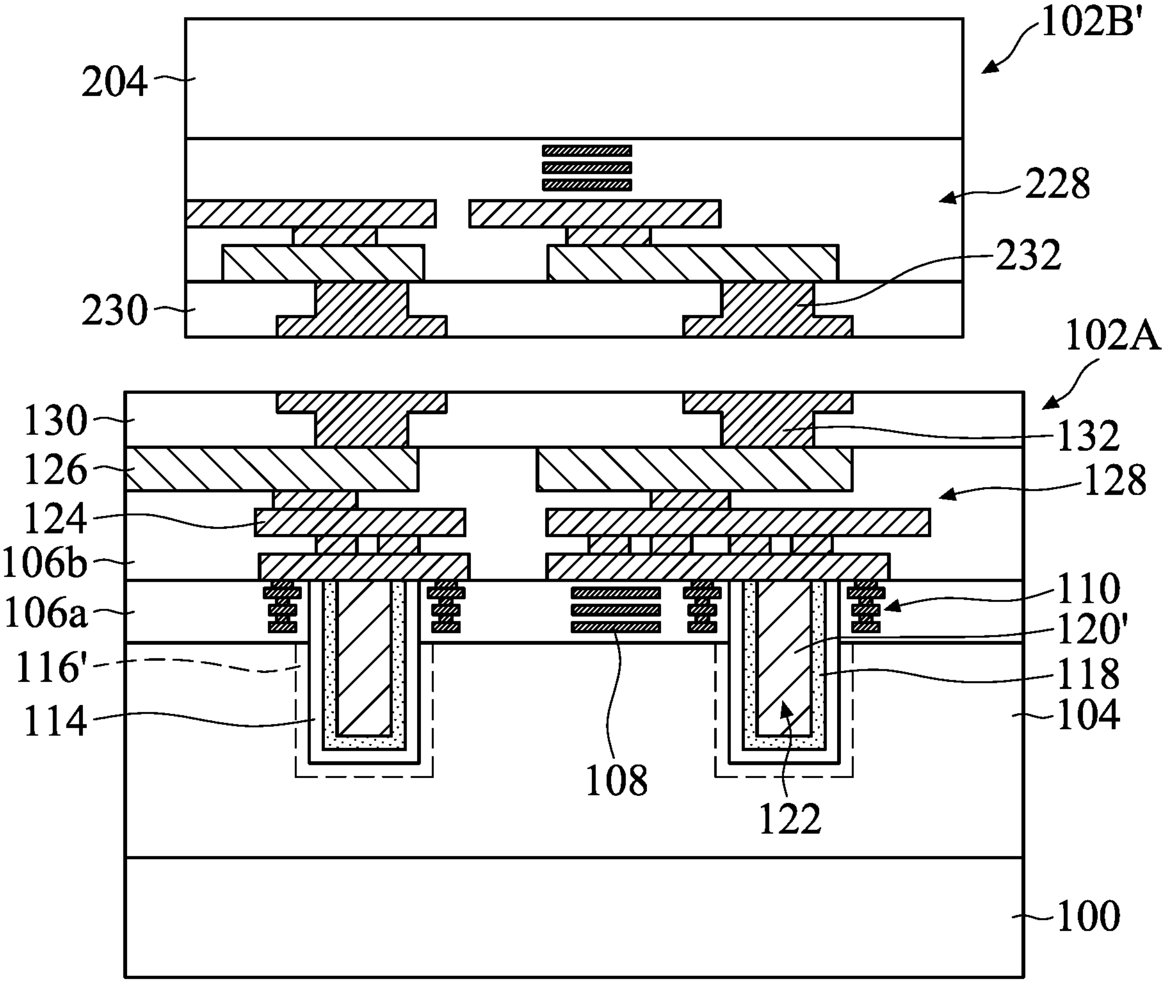
FIGS. 6A-6D are cross-sectional views of various stages of a process for forming a portion of a semiconductor device structure, in accordance with some embodiments.

FIGS. 6A-6D are cross-sectional views of various stages of a process for forming a portion of a semiconductor device structure, in accordance with some embodiments. As shown in FIG. 6A, a chip structure 102A that is the same as or similar to the chip structure 102A shown in FIG. 1J is formed. In some embodiments, the chip structure (or chip-containing structure) 102A is a semiconductor wafer.

Afterwards, similar to the embodiments illustrated in FIG. 1J, a chip structure 102B' is picked up and ready to be bonded to the chip structure 102A, as shown in FIG. 6A in accordance with some embodiments. In some embodiments, the chip structure 102B' is tested to ensure good quality before being bonded to the chip structure 102A. In some embodiments, the chip structure 102A (such as a semiconductor wafer) is wider than the chip structure 102B', as shown in FIG. 6A.

Figure 6B:
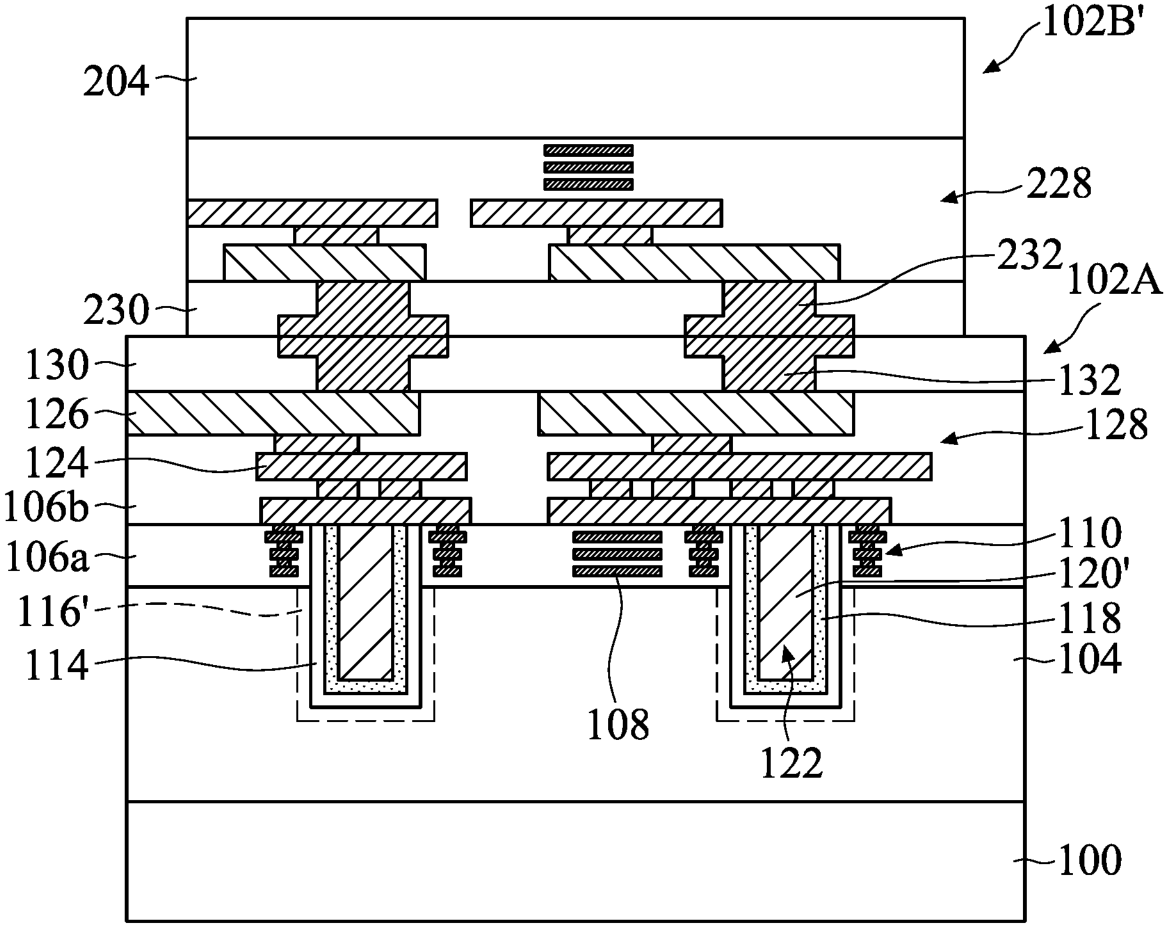

As shown in FIG. 6B, similar to the embodiments illustrated in FIG. 1K, the chip structure 102B' is bonded to the chip structure 102A through dielectric-to-dielectric bonding and metal-to-metal bonding, in accordance with some embodiments. In some embodiments, there is no tin-containing solder element formed between the chip structures 102A and 102B'.

Figure 6C:
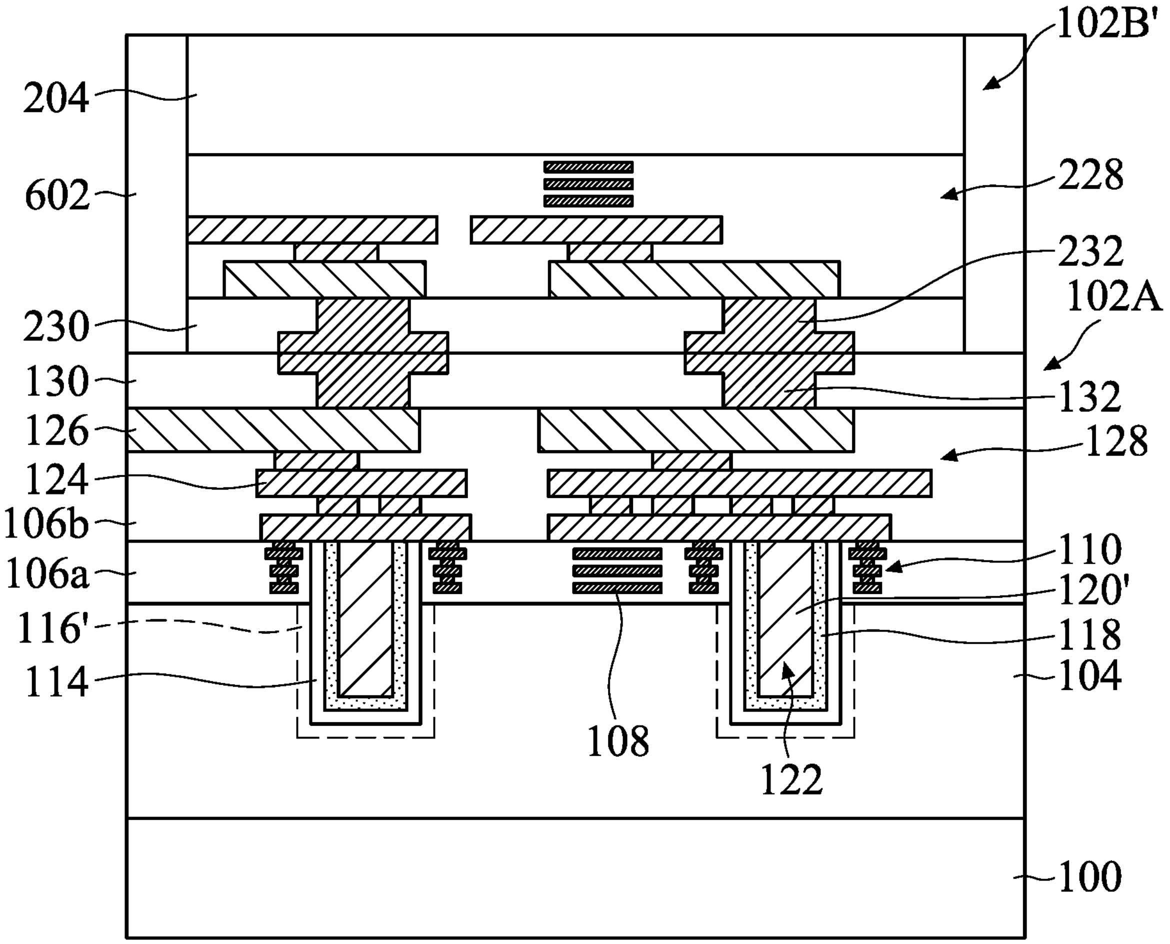

As shown in FIG. 6C, a protective layer 602 is formed over the chip structure 102A to laterally surround the chip structure 102B', in accordance with some embodiments. The protective layer 602 may be made of or include a molding material. The molding material may include an epoxy-based material dispersed with fillers such as silica fibers. Alternatively, the protective layer 602 may be made of or include silicon oxide or the like. A planarization process may be performed to partially remove the protective layer 602, so as to expose the chip structure 102B'. The heat dissipation of the chip structure 102B may thus be improved.

Figure 6D:
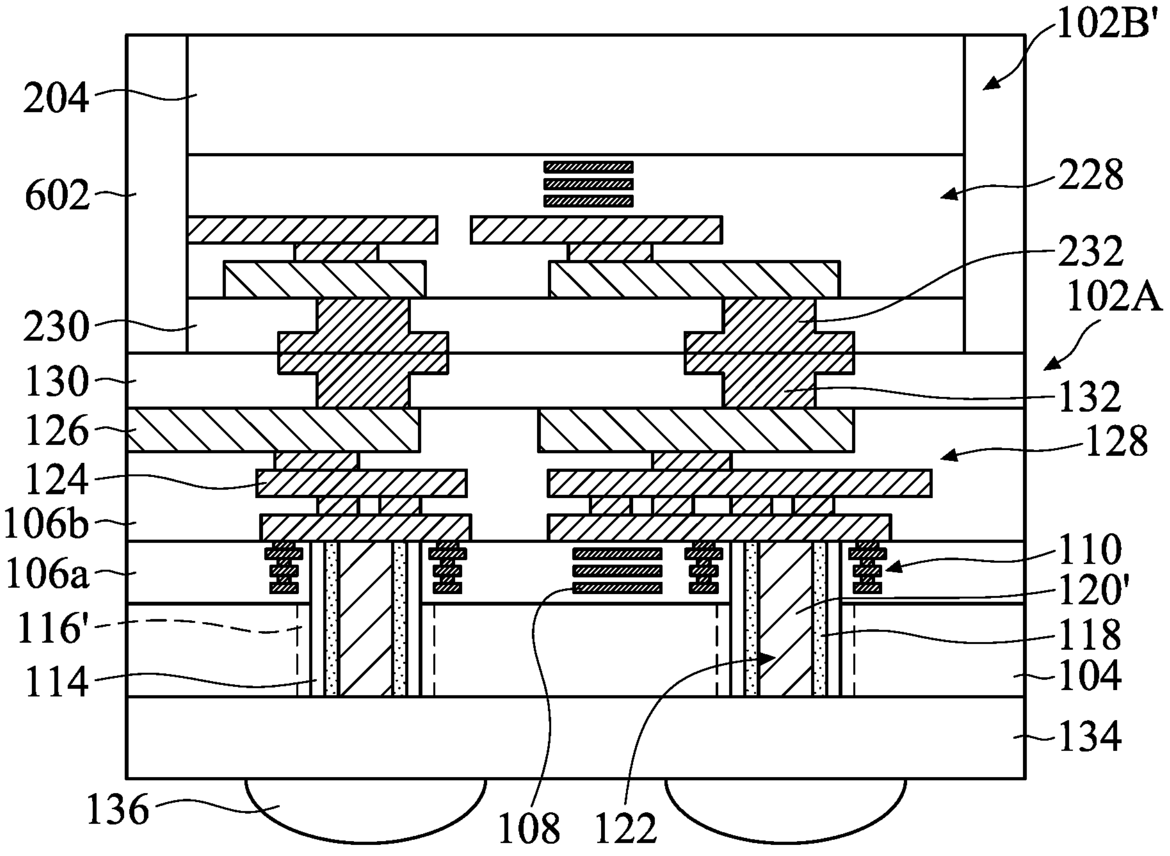

Afterwards, multiple processes that are the same as or similar to those illustrated in the embodiments shown in FIGS. 1L-1M are performed. As a result, the structure shown in FIG. 6D is formed, in accordance with some embodiments.

In some embodiments, a sawing process is used to separate the structure into multiple package structures. One of the package structures is shown in FIG. 6D. The package structure may function as a system on integrated chips (SoIC) that may further be integrated into a chip on wafer on substrate (CoWoS) package structure, an integrated fan-out (InFO) package structure, or the like.

Figure 7:
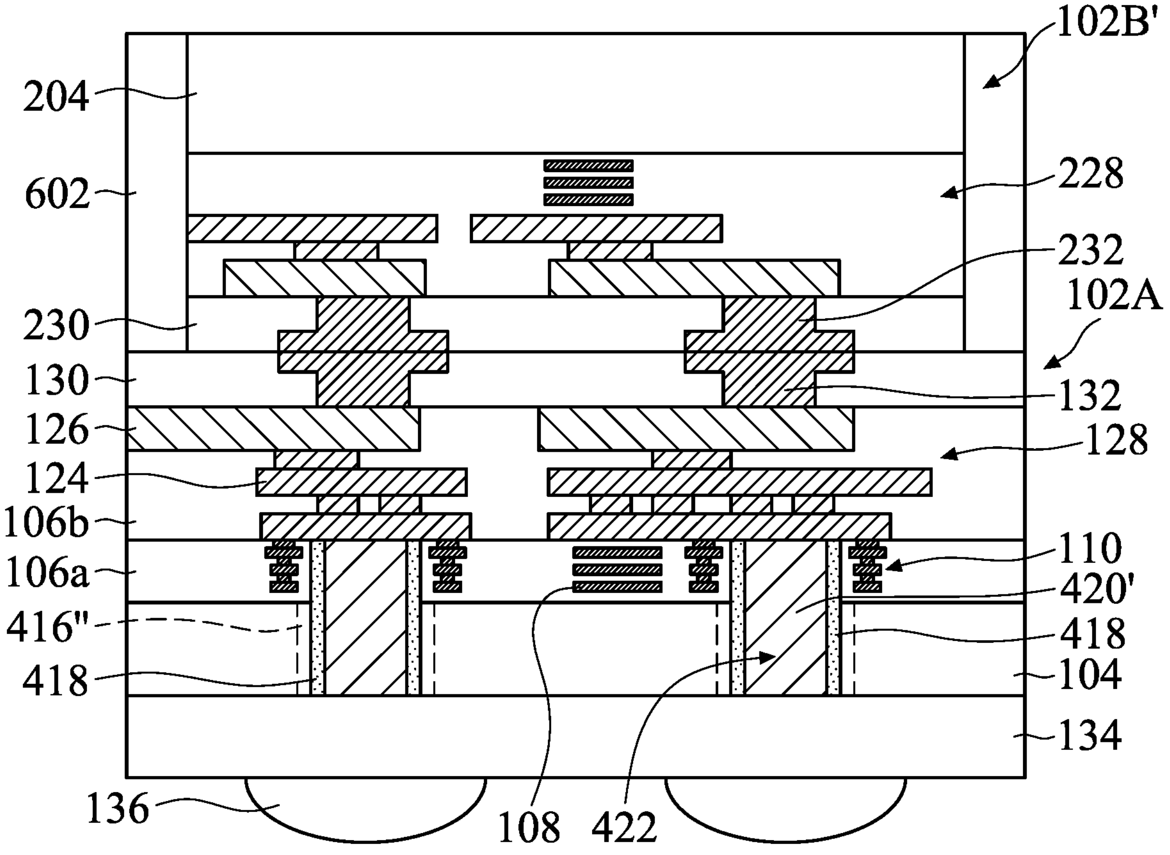
FIG. 7 is a cross-sectional view of a portion of a semiconductor device structure, in accordance with some embodiments.

FIG. 7 is a cross-sectional view of a portion of a semiconductor device structure, in accordance with some embodiments. In some embodiments, a semiconductor device structure or a package structure that is similar to the embodiments shown in FIG. 4H is formed. In some embodiments, similar to the embodiments shown in FIGS. 6A-6D, the semiconductor device structure or the package structure shown in FIG. 7 is formed using a chip-on-wafer (CoW) process.

Many variations and/or modifications can be made to embodiments of the disclosure. The modified portions and the conductive structures surrounded by the modified portions are not limited to be formed in a chip structure. In some other embodiments, the modified portions and the conductive structures surrounded by the modified portions are formed in a semiconductor interposer of a CoWoS package. The semiconductor interposer with the modified portions and the conductive structures may thus have better heat dissipation and faster signal transmission speed.

Embodiments of the disclosure form a semiconductor device structure or a package structure that includes through semiconductor vias that are surrounded by a semiconductor body. Modified portions are formed in the semiconductor body to surround the through semiconductor vias. The modified portions have a lower dopant concentration than other portions of the semiconductor body. The modified portions may help to reduce the capacitance near the through semiconductor vias. The operation speed and heat dissipation of the semiconductor device structure or the package structure may thus be improved. The reliability and performance of the semiconductor device structure or the package structure are greatly improved.

In accordance with some embodiments, a method for forming a semiconductor device structure is provided. The method includes forming an opening in a semiconductor body. The semiconductor body is doped with first-type dopants, and the semiconductor body is first-type doped. The method also includes introducing second-type dopants into the semiconductor body to form a modified portion near the opening. The modified portion remains first-type doped. The method further includes forming a dielectric layer along the sidewalls and the bottom of the opening. In addition, the method includes forming a conductive structure over the dielectric layer to fill the opening.

In accordance with some embodiments, a method for forming a semiconductor device is provided. The method includes forming an opening in a semiconductor body, and the semiconductor body is p-type doped. The method also includes introducing n-type dopants into the semiconductor body to form a modified portion near the opening, and the modified portion is p-type doped. The method further includes forming a dielectric layer along the sidewalls and the bottom of the opening. In addition, the method includes forming a conductive structure over the dielectric layer to fill the opening.

In accordance with some embodiments, a semiconductor device structure is provided. The semiconductor device structure includes a semiconductor body, and the semiconductor body is p-type doped. The semiconductor device structure also includes a conductive structure laterally surrounded by the semiconductor body. The semiconductor device structure further includes a dielectric layer between the conductive structure and the semiconductor body. In addition, the semiconductor device structure includes a modified portion formed in the semiconductor body. The modified portion laterally surrounds the conductive structure. The modified portion is p-type doped, and the modified portion contains n-type dopants.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
- forming an opening in a semiconductor body, wherein the semiconductor body is doped with first-type dopants, and the semiconductor body is first-type doped;
- introducing second-type dopants into the semiconductor body to form a modified portion near the opening, wherein the modified portion remains first-type doped;
- forming a dielectric layer along sidewalls and a bottom of the opening; and
- forming a conductive structure over the dielectric layer to fill the opening.

2. The method for forming a semiconductor device structure as claimed in claim 1, further comprising:
- forming a dopant source layer along the sidewalls and the bottom of the opening before the dielectric layer is formed; and
- heating the dopant source layer so that the second-type dopants from the dopant source layer are introduced into the semiconductor body to form the modified portion.

3. The method for forming a semiconductor device structure as claimed in claim 2, wherein the dopant source layer contains n-type dopants.

4. The method for forming a semiconductor device structure as claimed in claim 2, wherein the dopant source layer is formed to be in direct contact with the semiconductor body.

5. The method for forming a semiconductor device structure as claimed in claim 2, wherein the dopant source layer continuously surrounds the conductive structure.

6. The method for forming a semiconductor device structure as claimed in claim 1, further comprising:
- exposing the semiconductor body under an atmosphere containing n-type dopants; and
- heating the semiconductor body so that some of the n-type dopants diffuse into the semiconductor body and form the modified portion.

7. The method for forming a semiconductor device structure as claimed in claim 6, wherein the semiconductor body is heated while exposing the semiconductor body under the atmosphere containing n-type dopants.

8. The method for forming a semiconductor device structure as claimed in claim 1, wherein the dielectric layer is formed after the second-type dopants are introduced into the semiconductor body.

9. The method for forming a semiconductor device structure as claimed in claim 1, wherein the modified portion has an atomic concentration of p-type dopants, and the atomic concentration of p-type dopants gradually becomes smaller along a direction towards the conductive structure.

10. The method for forming a semiconductor device structure as claimed in claim 1, further comprising:
- heating the semiconductor body before the dielectric layer is formed, wherein a first part of the second-type dopants are introduced into the semiconductor body while the semiconductor body is heated;
- electroplating a conductive material filling the opening;
- annealing the conductive material, wherein a second part of the second-type dopants are introduced into the semiconductor body while the conductive material is annealed; and
- planarizing the conductive material, wherein a remaining portion of the conductive material forms the conductive structure.

11. A method for forming a semiconductor device structure, comprising:
- forming an opening in a semiconductor body, wherein the semiconductor body is p-type doped;
- introducing n-type dopants into the semiconductor body to form a modified portion near the opening, wherein the modified portion is p-type doped;
- forming a dielectric layer along sidewalls and a bottom of the opening; and
- forming a conductive structure over the dielectric layer to fill the opening.

12. The method for forming a semiconductor device structure as claimed in claim 11, further comprising:
- forming an n-type dopant source layer along the sidewalls and the bottom of the opening; and heating the n-type dopant source layer so that the n-type dopants from the n-type dopant source layer are introduced into the semiconductor body to form the modified portion.

13. The method for forming a semiconductor device structure as claimed in claim 12, wherein the n-type dopant source layer is formed to be in direct contact with the semiconductor body.

14. The method for forming a semiconductor device structure as claimed in claim 11, further comprising:

introducing an n-type dopant containing gas into the opening; and heating the semiconductor body so that the n-type dopants from the n-type dopant containing gas are introduced into the semiconductor body.

15. The method for forming a semiconductor device structure as claimed in claim 14, wherein the dielectric layer is formed to be in direct contact with the modified portion.

16. A method for forming a semiconductor device structure, comprising:

forming an opening in a semiconductor body, wherein the semiconductor body is p-type doped;

introducing n-type dopants into the semiconductor body to form a modified portion extending along sidewalls and a bottom of the opening;

forming a dielectric layer along the sidewalls of the opening; and forming a conductive structure over the dielectric layer to fill the opening.

17. The method for forming a semiconductor device structure as claimed in claim 16, further comprising:

forming an n-type dopant source layer along the sidewalls of the opening; and heating the n-type dopant source layer so that the n-type dopants from the n-type dopant source layer are introduced into the semiconductor body to form the modified portion.

18. The method for forming a semiconductor device structure as claimed in claim 16, further comprising:

forming a plurality of dielectric layers and a plurality of conductive features over the semiconductor body, wherein the opening extends through the dielectric layers and extends into the semiconductor body.

19. The method for forming a semiconductor device structure as claimed in claim 18, further comprising:

forming a protective ring structure laterally surrounded by the dielectric layers, wherein the protective ring structure laterally surrounds the conductive structure after the conductive structure is formed.

20. The method for forming a semiconductor device structure as claimed in claim 16, further comprising:

introducing an n-type dopant containing gas into the opening; and heating the semiconductor body so that the n-type dopants from the n-type dopant containing gas are introduced into the semiconductor body.

* * * * *